(12) United States Patent
Wakayanagi et al.

(10) Patent No.: US 8,835,296 B2
(45) Date of Patent: Sep. 16, 2014

(54) ELECTRONIC COMPONENT MANUFACTURING METHOD INCLUDING STEP OF EMBEDDING METAL FILM

(75) Inventors: Shunichi Wakayanagi, Hino (JP); Takayuki Saito, Kawasaki (JP); Takuya Seino, Kawasaki (JP); Akira Matsuo, Kawasaki (JP); Koji Yamazaki, Tokyo (JP); Eitaro Morimoto, Kome (JP); Yohsuke Shibuya, Isehara (JP); Yu Sato, Fiuchu (JP); Naomu Kitano, Machida (JP)

(73) Assignee: Canon Anelva Corporation, Kawasaki-shi (JP)

( * ) Notice: Subject to any disclaimer, the term of this patent is extended or adjusted under 35 U.S.C. 154(b) by 0 days.

(21) Appl. No.: 13/163,989

(22) Filed: Jun. 20, 2011

(65) Prior Publication Data
US 2012/0161322 A1    Jun. 28, 2012

(30) Foreign Application Priority Data

Dec. 28, 2010    (JP) ................................. 2010-294009

(51) Int. Cl.
*H01L 29/45*    (2006.01)
*H01L 21/285*    (2006.01)

(52) U.S. Cl.
USPC ........ 438/592; 438/632; 438/585; 156/345.2; 156/345.46; 257/412

(58) Field of Classification Search
USPC ........... 257/751, E21, 161, E29.143; 438/592
See application file for complete search history.

(56) References Cited

U.S. PATENT DOCUMENTS

| | | | |
|---|---|---|---|
| 4,976,839 A | 12/1990 | Inoue | |
| 5,747,361 A | 5/1998 | Ouellet | |
| 5,962,923 A | 10/1999 | Xu et al. | |
| 6,045,666 A | 4/2000 | Satitpunwaycha et al. | |
| 6,130,150 A * | 10/2000 | Merchant et al. | 438/618 |

(Continued)

FOREIGN PATENT DOCUMENTS

| | | |
|---|---|---|
| JP | 2-34918 A | 2/1990 |
| JP | 5-267475 A | 10/1993 |

(Continued)

OTHER PUBLICATIONS

Schell et al. ("Growth Mode and Texture Development in TiN Films during Magnetron Sputtering—an in situ Synchrotron Radiation Study" Annual Report IIM 2001).*

(Continued)

*Primary Examiner* — Asok K Sarkar
*Assistant Examiner* — Dmitriy Yemelyanov
(74) *Attorney, Agent, or Firm* — Fitzpatrick, Cella, Harper & Scinto

(57) ABSTRACT

The present invention provides an electronic component manufacturing method including a step of embedding a metal film. An embodiment of the present invention includes a first step of depositing a barrier layer containing titanium nitride on an object to be processed on which a concave part is formed and a second step of filling a low-melting-point metal directly on the barrier layer under a temperature condition allowing the low-melting-point metal to flow, by a PCM sputtering method while forming a magnetic field by a magnet unit including plural magnets which are arranged at grid points of a polygonal grid so as to have different polarities between the neighboring magnets.

13 Claims, 17 Drawing Sheets

32 nm OPENING TRENCH 15 nm OPENING TRENCH

(56) References Cited

U.S. PATENT DOCUMENTS

| | | | |
|---|---|---|---|
| 6,130,158 A | 10/2000 | Hibino | |
| 6,136,095 A | 10/2000 | Xu et al. | |
| 6,217,721 B1* | 4/2001 | Xu et al. | 204/192.17 |
| 6,238,533 B1 | 5/2001 | Satitpunwaycha et al. | |
| 6,313,027 B1 | 11/2001 | Xu et al. | |
| 6,461,483 B1 | 10/2002 | Gopalraja et al. | |
| 6,746,962 B2 | 6/2004 | Kishida et al. | |
| 8,030,694 B2 | 10/2011 | Nakagawa et al. | |
| 8,231,767 B2 | 7/2012 | Iori et al. | |
| 2002/0050648 A1* | 5/2002 | Kishida et al. | 257/763 |
| 2002/0089027 A1 | 7/2002 | Xu et al. | |
| 2003/0024478 A1* | 2/2003 | Egami et al. | 118/723 MA |
| 2004/0241980 A1* | 12/2004 | Yamazaki et al. | 438/632 |
| 2009/0179285 A1* | 7/2009 | Wood et al. | 257/412 |
| 2010/0330813 A1 | 12/2010 | Nakagawa et al. | |
| 2011/0186931 A1* | 8/2011 | Marxsen et al. | 257/368 |

FOREIGN PATENT DOCUMENTS

| | | | |
|---|---|---|---|
| JP | 6-509682 A | 10/1994 | |
| JP | 8-111413 A | 4/1996 | |
| JP | 9-41133 A | 2/1997 | |
| JP | 9-120991 A | 5/1997 | |
| JP | 3193875 B2 | 5/2001 | |
| JP | 2002-363740 A | 12/2002 | |
| JP | 2004-506090 A | 2/2004 | |
| JP | 2004-162138 A | 6/2004 | |
| JP | 2007-27392 A | 2/2007 | |
| KR | 2002-0032400 A | 5/2002 | |
| WO | 01/68934 A1 | 9/2001 | |
| WO | 2009/157186 A1 | 12/2009 | |

OTHER PUBLICATIONS

Office Action in Korean Patent Application No. 10-2011-0062823, with English translation (issued Sep. 18, 2012) (13 pages).

Office Action in Taiwanese Patent Application No. 100122221, issued Jul. 15, 2013, with English translation (14 pages).

Office Action issued in Japanese Patent Application No. 2010-294009, dated May 2, 2014 (3 pages).

* cited by examiner

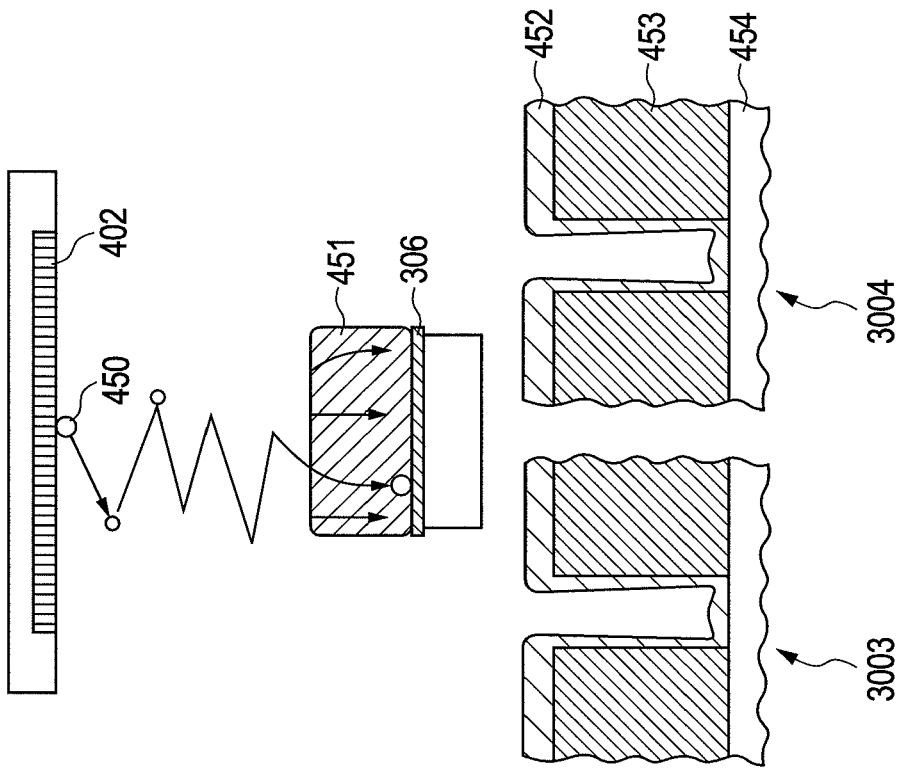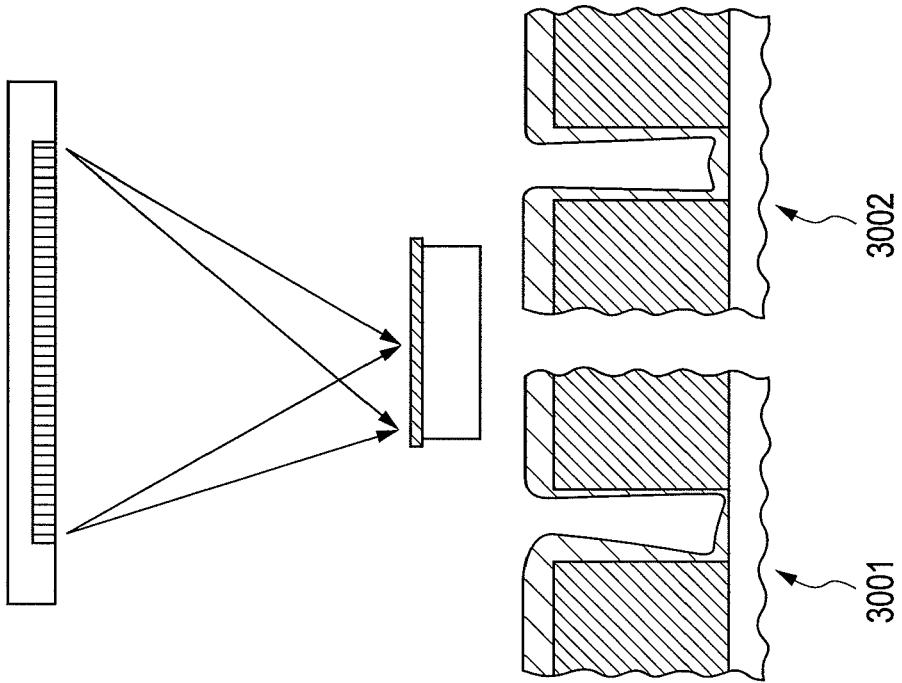

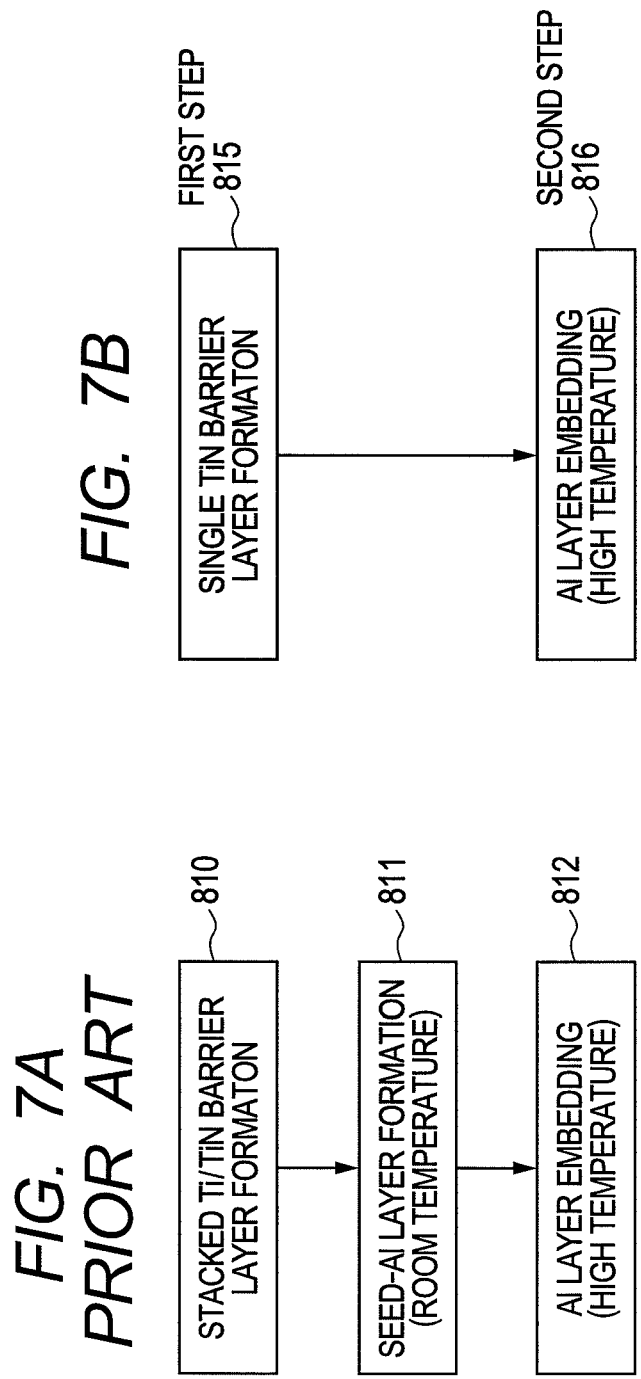

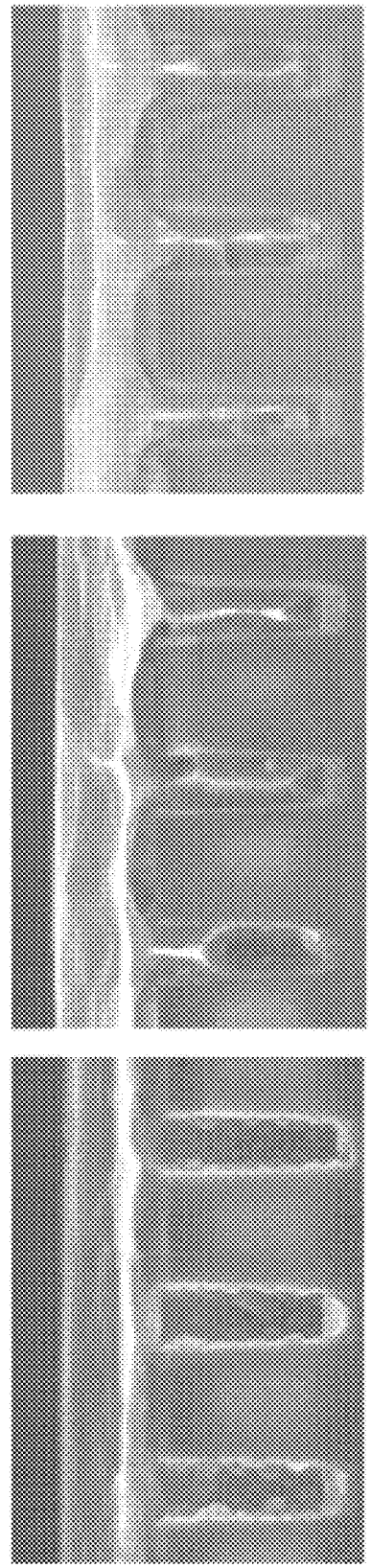

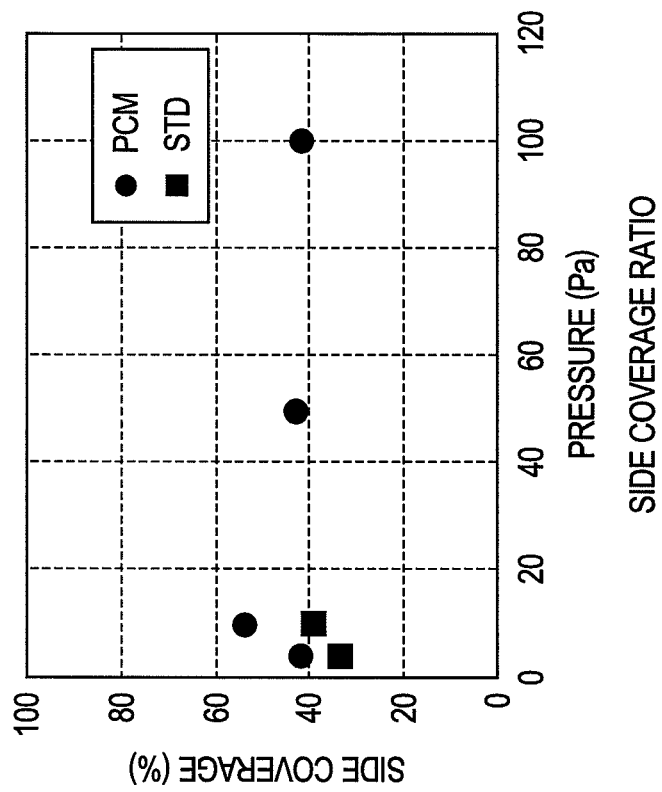
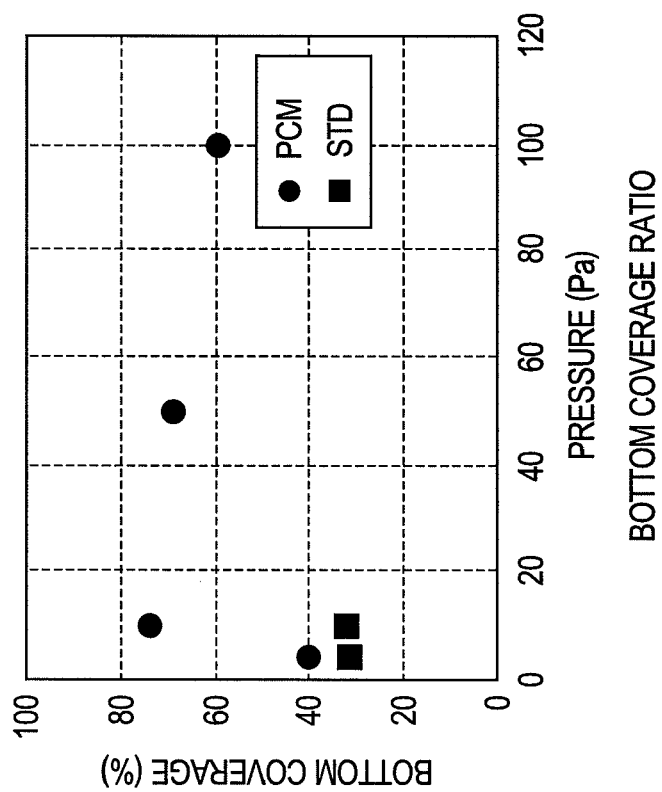
FIG. 14A
FIG. 14B

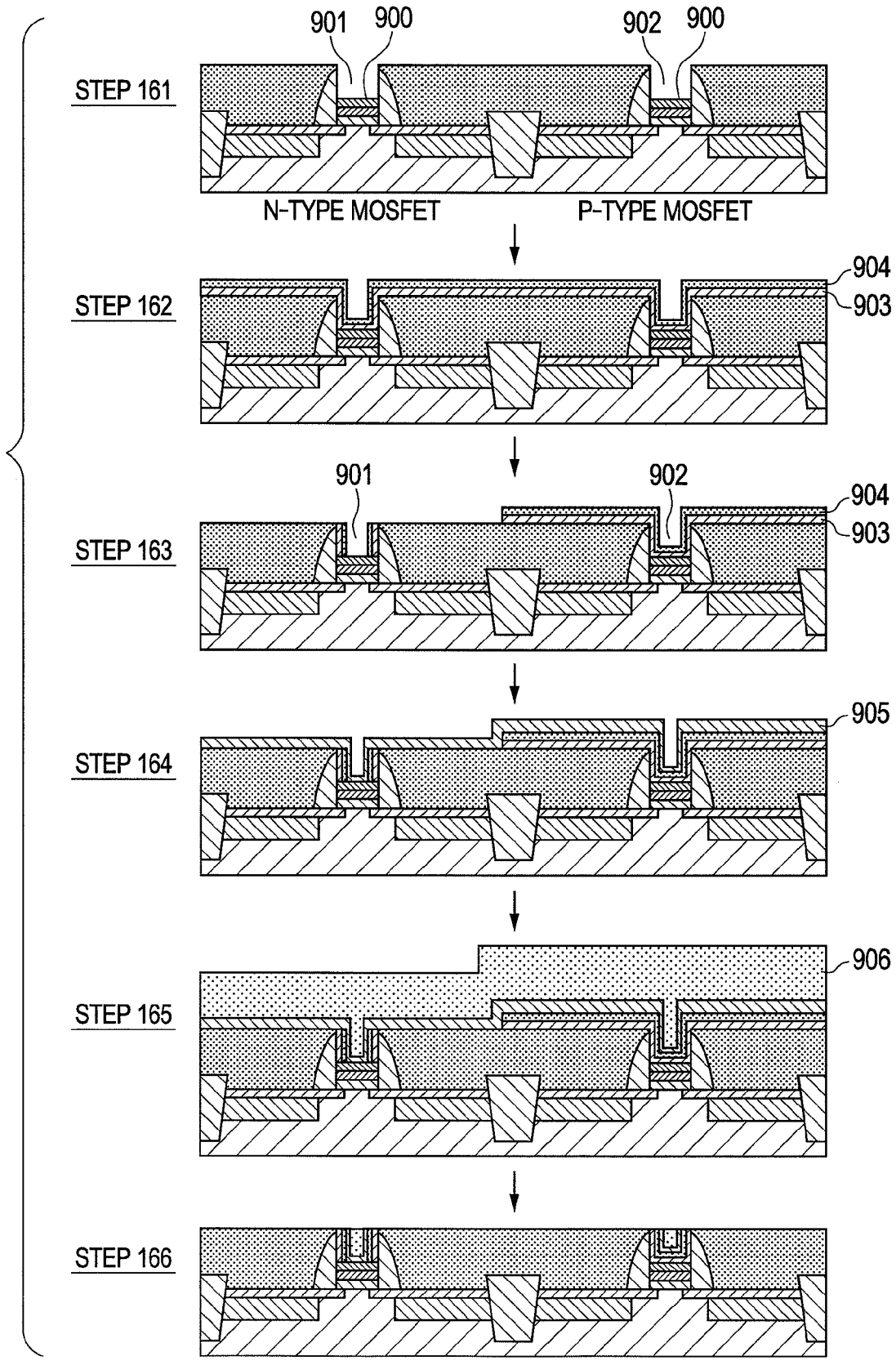

ELECTRONIC COMPONENT MANUFACTURING METHOD INCLUDING STEP OF EMBEDDING METAL FILM

BACKGROUND OF THE INVENTION

1. Field of the Invention

The present invention relates to an electronic component manufacturing method which includes a step of embedding a metal film.

2. Description of the Related Art

Conventionally, the semiconductor integrated circuit has been using a gate first method which is a method of performing processing by etching after having formed a gate insulating film and a gate electrode on a wafer surface. Recently, a gate insulating film of a MOSFET becoming thinner as the element is miniaturized, and, when an $SiO_2$ film is used for the gate insulating film, tunnel current is generated for a film thickness of 2 nm or smaller which is a recently required value, and gate leak current is increased. Accordingly, it is being studied recently to replace the gate insulating film material by a high-permittivity material which has a relative permittivity higher than that of the $SiO_2$ film. By this method, an $SiO_2$-converted film thickness (EOT: Equivalent Oxide Thickness) can be made smaller even when the actual thickness of an insulating film is made larger. In a recent MOSFET having a gate length of 22 nm or smaller, however, the EOT is required to be reduced further. For satisfying this requirement, it is necessary to increase the actual thickness of the insulating film by using the high-permittivity material to reduce the gate leak current. In the gate first method, however, source/drain formation step is performed after gate formation and thereby the gate insulating film and the gate electrode are heated to cause heat diffusion between the insulating film and the metal film due to the heating, and there is arising a problem that mobility degradation and an operation voltage (Vt) shift occur.

Accordingly, for solving these problems, there has been carried out energetic research and development for a gate last method which forms the source/drain in advance and forms the gate insulating film and the gate electrode lastly. In this method, since the gate part is formed lastly, the heating temperature applied to the gate part can be made lower and probably it is possible to suppress the mobility degradation and the operation voltage (Vt) shift which have been the problems in the gate first method. Subjects of the gate last method are to deposit various kinds of metal thin film in a shape having an opening of 22 nm or smaller and a depth of 22 nm or larger (hereinafter, called a trench), and to control the film thicknesses of the material deposited on the side wall and the bottom part of the trench to desired values, respectively. Further, since the various kinds of metal thin film are stacked, it is also necessary to suppress mutual diffusion between the metal thin films.

In the gate last method, the method of forming the various kinds of metal thin film material includes a CVD (Chemical Vapor Deposition) method, an atomic layer adsorption/deposition method, and a sputtering method. The CVD method has problems in film thickness controllability, surface uniformity, and reproducibility, since an incubation time exists in the forming process. The atomic layer adsorption/deposition method has excellent film thickness controllability, but, when a thick film is formed, a growth time becomes long and a cost problem occurs because an expensive source gas is used. Each of these methods using the chemical reaction of source gas can form a film uniformly not only on the bottom part but also on the side wall of the trench, but, on the other hand, the trench comes to have a narrower opening when the deposited film thickness is made larger. As a method of solving these problems, there is proposed a method of forming the various kinds of metal thin film material by a sputtering method which has excellent film thickness controllability, surface uniformity, and reproducibility.

Japanese Unexamined Patent Application Publication (Translation of PCT Application) No. 2004-506090 discloses an apparatus which can form a film also on the side wall of the trench part as the CVD by performing sputtering at a high pressure of 1 Torr or higher. In this method, the directivity of a sputter ion against a wafer surface is suppressed by the sputtering at a high pressure and thereby it is possible to form a film also on the side wall of the trench part. Japanese Patent No. 3193875 discloses a technique and an apparatus in which a Seed-Al layer is formed by a sputtering method for accelerating Al film migration after a barrier underlayer stacking Ti and TiN has been formed and Al is caused to migrate at a high temperature to be embedded. This method shows that it is possible to embed Al into the trench while suppressing Al diffusion by the barrier underlayer stacking Ti and TIN.

As described above, in the recent film formation on an extremely fine pattern, various kinds of metal thin film are stacked and thereby the reduction of a trench opening diameter is caused. Accordingly, it is necessary to use a metal thin film formation technique which can suppress the reduction of the opening diameter as far as possible even when the various kinds of metal thin film are stacked. Further, it is clear that the Al embedding deteriorates the characteristic of a metal film used in the gate electrode part by the Al diffusion, and thereby an extremely-thin film barrier layer forming technique is required for suppressing the Al diffusion.

However, each of the above described techniques has the following problem.

The method of sputtering at a high pressure of 1 Torr or higher, which is disclosed in Japanese Unexamined Patent Application Publication (Translation of PCT Application) No. 2004-506090, can form a film onto the trench side wall, but has a problem that the trench opening becomes narrower when the trench opening is made smaller as 22 nm or smaller. Further, the method of Al embedding, which is disclosed in Japanese Patent No. 3193875, has a problem that a thick barrier film stacking Ti and TiN is required to be formed for suppressing the Al diffusion. Moreover, since the Seed-Al layer is further formed on the barrier film stacking Ti and TiN for accelerating the Al migration, there is a problem that the trench opening is narrowed.

SUMMARY OF THE INVENTION

An object of the present invention is to provide a electronic component manufacturing method including a step of embedding a metal film (e.g., Al) into a concave part (e.g., trench), which method can suppress the reduction of an opening of the concave part formed on a substrate and can form a barrier film capable of suppressing the diffusion of the metal to be embedded.

As a result of keen study to solve the above problems, the present inventors have found that an extremely-thin TiN single-layer barrier film can be formed in a concave part (e.g., trench part) formed on a substrate by the use of a deposition apparatus of the present invention and further the Al embedding can be performed on a TiN single-layer film even without the Seed-Al layer, and have arrived at the completion of the present invention.

A first aspect of the present invention is an electronic component manufacturing method, comprising:

a first step of depositing a single barrier layer including titanium nitride in a concave part formed on an object to be processed by a sputtering method while forming a cusped magnetic field on a target surface; and a second step of filling a low-melting-point metal layer directly on the single barrier layer under a temperature condition allowing the low-melting-point metal layer to flow.

In such a configuration, it is possible to embed Al without reducing an opening diameter or by suppressing the reduction of the opening diameter even in a fine trench having an opening diameter of 22 nm or smaller.

A second aspect of the present invention is an electronic component manufacturing apparatus, comprising: a sputtering means including a target electrode which is connected with a high-frequency power source and capable of mounting a target, and a magnet unit configured to form a cusped magnetic field on a surface of the target when the target is mounted on the target electrode; and a control unit controlling the sputtering means, wherein when a target containing titanium or titanium nitride is disposed on the target electrode and a barrier layer is formed in a concave part formed on an object to be processed, the control unit is configured to control the sputtering means so that a single barrier layer containing titanium nitride is formed in the concave part.

A third aspect of the present invention is an electronic component manufacturing apparatus, comprising: a first sputtering apparatus including: a first sputtering means having a first target electrode which is connected with a first high-frequency power source and capable of mounting a target, and a first magnet unit configured to form a cusped magnetic field on a surface of the target when the target is mounted on the first target electrode; and a first control unit configured to control the first sputtering means so that a single barrier layer containing titanium nitride is formed in a concave part, when a target containing titanium or titanium nitride is disposed on the first target electrode and a barrier layer is formed in the concave part formed on an object to be processed: and a second sputtering apparatus including: a second sputtering means having a second target electrode which is connected with a second high-frequency power source and capable of mounting a target and a second magnet unit configured to form a cusped magnetic field on a surface of the target when the target is mounted on the second target electrode; and a second control unit configured to control the second sputtering means so as to form low-melting-point metal layer directly on the single barrier layer and to embed the low-melting-point metal in the concave part under a temperature condition allowing the low-melting-point metal layer to flow, when a target containing the low-melting-point metal is disposed on the second target electrode and the low-melting-point metal is embedded in the concave part where the single barrier layer is formed.

A fourth aspect of the present invention is an electronic component, comprising: a member including a concave part; an electrode layer formed within the concave part; a low-melting-point metal layer embedded within the concave part; and a barrier layer formed between the low melting point layer and the electrode layer and including titanium nitride, the barrier layer having (220) orientation.

According to the present invention, by forming a extremely-thin TiN single-layer barrier film within a concave part (e.g., trench) formed on the substrate and embedding a low-melting-point metal (e.g., Al) on the TiN single-layer barrier film, it is possible to embed the low-melting-point metal (e.g., Al) without reducing an opening diameter or by suppressing the reduction of the opening diameter even in a fine concave part having an opening diameter of 22 nm or smaller, for example, while causing the TiN single-layer barrier film to have preferable barrier properties of suppressing the diffusion of the low-melting-point metal into an underlayer. Accordingly, also when the electronic component manufacturing method of the present invention including the step of embedding a metal film is applied to a manufacturing method of a wiring step, it is possible to embed Al without reducing an opening diameter or by suppressing the reduction of the opening diameter in a fine concave part having an opening diameter of 22 nm or smaller.

BRIEF DESCRIPTION OF THE DRAWINGS

FIG. 3A is an explanatory diagram of a low-pressure sputter particle transfer process and a shape of a sputtered film deposited in a trench according to an embodiment of the present invention.

FIG. 3B is an explanatory diagram of a high-pressure sputter particle transfer process and a shape of a sputtered film deposited in a trench according to an embodiment of the present invention.

FIG. 7A is a flowchart showing a conventional sequence of embedding Al into a trench.

FIG. 7B is a flowchart showing a sequence of embedding Al into a trench according to an embodiment of the present invention.

FIGS. 9A to 9C are diagrams showing the influence of atmosphere exposure on Al embedding characteristic according to an embodiment of the present invention.

FIG. 14A is a diagram showing pressure dependence of a deposited amount of a TiN single-layer barrier film on the bottom part of a trench according to an embodiment of the present invention.

FIG. 14B is a diagram showing pressure dependence of a deposited amount of a TiN single-layer barrier film on the side wall part of a trench according to an embodiment of the present invention.

FIG. 16 is a diagram showing the steps of a semiconductor apparatus manufacturing method in Example 2 of the present invention.

DETAILED DESCRIPTION OF THE INVENTION

Hereinafter, an embodiment of the present invention will be explained in detail according to the drawings.

As a result of keen study to solve the above problems, the present inventors have found an electronic component manufacturing method including a step of embedding Al into a trench part using a barrier film which can suppress the reduction of a trench opening and suppress Al diffusion, by forming an extremely-thin TiN single-layer barrier film and embedding Al on the TiN single-layer barrier film.

Figure 1:
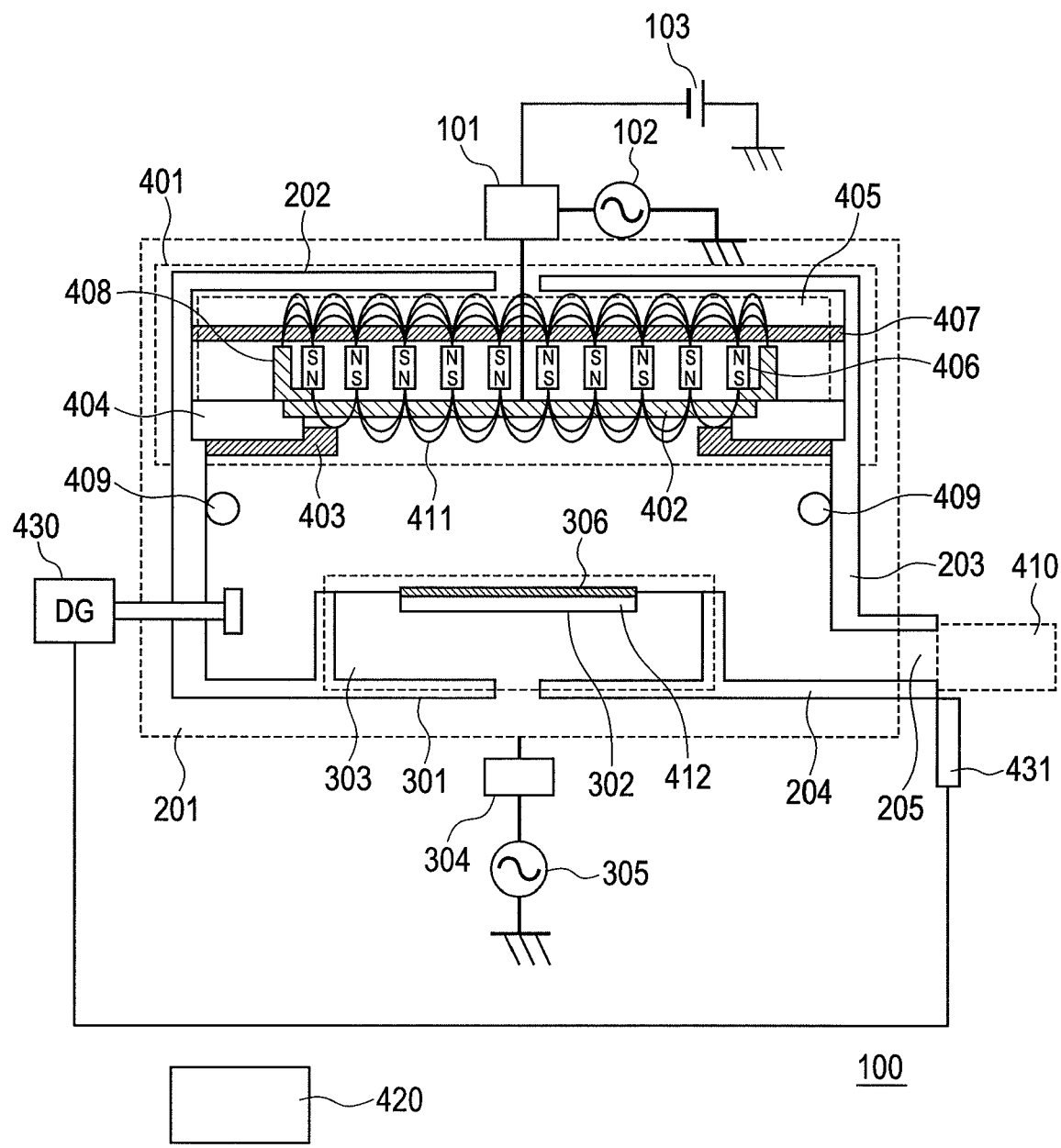
FIG. 1 is a schematic diagram of a processing apparatus according to an embodiment of the present invention.

FIG. 1 shows an outline of an apparatus according to an embodiment of the present invention which is used in a first step of forming a titanium nitride film as a barrier layer within a concave part (e.g., trench) formed on a substrate and a second step of forming an Al film as a low-melting-point metal layer on the titanium nitride film formed within the concave part to embed Al into the concave part.

A semiconductor manufacturing apparatus 100 according to an embodiment of the present invention includes a chamber 201 having an upper electrode 401 and a lower electrode 301 as shown in FIG. 1. The chamber 201 functions as a vacuum processing container and has a vacuum exhaust pump 410 connected to an exhaust port 205 for exhausting the inside of the chamber 201 together with an automatic pressure control mechanism (APC) 431. The upper electrode 401 is connected with an upper electrode high-frequency power source 102 and a DC power source 103 via a matching box 101. Further, the lower electrode 301 is connected with a lower electrode high-frequency power source 305 via a matching box 304.

The chamber 201 has an approximately cylindrical shape and includes an upper wall (ceiling wall) 202 having an approximately disk-like shape, a side wall 203 having an approximately cylindrical shape, and a bottom wall 204 having an approximately disk-like shape. A pressure indicator 430 (e.g., diaphragm gauge) is provided around the side wall 203 within the chamber 201 for measuring pressure. The pressure indicator 430 is electrically connected to the automatic pressure control mechanism 431 which is configured to be able to control the pressure within the chamber 201 automatically according to a pressure value measured by the pressure indicator 430.

The upper electrode 401 has the upper wall 202, a magnet mechanism 405, a target electrode (first electrode) 402, an insulator 404, and a shield 403. The magnet mechanism 405 is provided below the upper wall 202 and the target electrode 402 is provided below the magnet mechanism 405. Further, the insulator 404 insulates the target electrode 402 from the side wall of the chamber 201 and also holds the target electrode 402 within the chamber 201. Moreover, the shield 403 is provided below the insulator 404. Here, the target electrode 402 is connected with the upper electrode high-frequency power source 102 and the DC power source 103 via the matching box 101. Main parts of the target electrode 402 are made of non-magnetic material such as Al, SUS, and Cu. A material target member (not shown in the drawing) which is necessary for forming a film on a substrate 306 can be disposed on the reduced-pressure side (substrate side) of the target electrode 402. Further, a pipe arrangement is formed in the upper electrode 401 and the target electrode 402 and the upper electrode 401 and the target electrode 402 can be cooled by cooling water flowing in this pipe arrangement.

The magnet mechanism 405 has a magnet support plate 407, plural magnet pieces 406 supported by the magnet support plate 407, and a magnetic field adjustment magnetic body 408 provided on the outermost perimeter side of the plural magnet pieces 406. Here, the magnet mechanism 405 is configured to be rotatable with a center axis of the material target as a rotation axis by means of a rotation mechanism which is not shown in the drawing. The plural magnet pieces 406 are disposed neighboring each other above the target electrode 402 so as to be arranged in parallel to the surface of the target electrode 402. The neighboring magnet pieces 406 form a closed point-cusped magnetic field 411 for confining plasma. The magnetic field adjustment magnetic body 408 is extended so as to partially overlap the magnet piece 406 located on the outer perimeter side on the side of the target electrode 402. By such a configuration, it is possible to suppress (control) the magnetic field strength in a gap between the target electrode 402 and the shield 403.

The lower electrode 301 has a stage holder 302, a cooling/heating mechanism 412, a bottom wall 204, and a second electrode insulator 303. The stage holder 302 is a unit for mounting the substrate 306 and is provided with the cooling/heating mechanism 412 therein. The temperature of the substrate (substrate temperature) can be controlled to a predetermined temperature by means of the cooling/heating mechanism 412. The second electrode insulator 303 is a unit for supporting the stage holder 302 and the bottom wall 204 of the chamber 201 while insulating them from each other. Further, the stage holder 302 is connected with the lower electrode high-frequency power source 305 via the matching box 304. Here, the stage holder 302 is provided with an electrostatic adsorption unit having a single pole electrode, which is not shown in the drawing, and this single pole electrode is connected with the DC power source (not shown in the drawing). Further, not shown in the drawing, the stage holder 302 is provided with plural gas (e.g., inert gas such as Ar) ejection ports for supplying gas to the rear side of the substrate 306 for controlling the temperature of the substrate 306 and a substrate temperature measurement unit for measuring the substrate temperature.

Inside the chamber 201, plural gas introduction ports 409 are provided for supplying process gas such as argon into the chamber 201.

Figure 2:
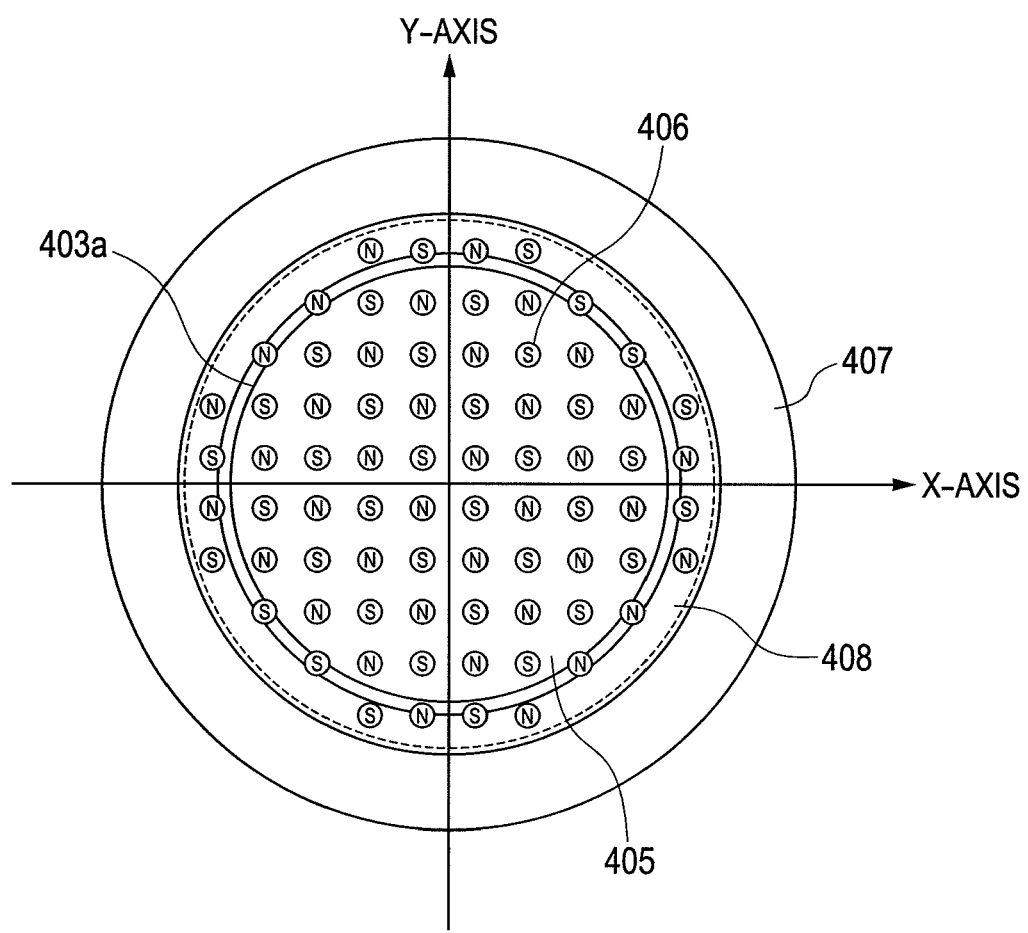
FIG. 2 is an arrangement diagram of a magnet mounted within a processing apparatus according to an embodiment of the present invention.

With reference to FIG. 2, the shape of the magnet mechanism 405 will be explained in detail. FIG. 2 is a plan view of the magnet mechanism 405 when viewed from the side of the target electrode 402. As shown in FIG. 2, the ring-shaped magnetic field adjustment magnetic body 408 and the magnet piece 406 disposed in the inner perimeter region of the magnetic field adjustment magnetic body 408 are supported by and provided at the disk-like magnet support body 407. Here, in FIG. 2, Reference numeral 403a indicates the inner diameter of the shield 403 and many small circles indicate the outer shapes of the respective magnet pieces 406. Further, each of the magnet pieces 406 has the same shape and the same magnetic flux density. Moreover, the characters N and S indicate magnetic poles of the magnet piece 406, respectively, when viewed from the side of the target electrode 402.

The magnet pieces 406 are arranged in a grid pattern (in the X-axis direction and the Y-axis direction) having approximately the same spacing (in a range of 5 to 100 mm) from each other. Each of the plural magnet pieces 406 is disposed at a grid point of a polygonal grid in this manner. The neighboring magnet pieces 406 have opposite polarities to each other. Meanwhile, in a rectangle including any four magnet pieces 406 arranged along the X-axis direction and the Y-axis direction, the polarities of the magnet pieces 406 neighboring each other along the diagonal direction are the same as each other. That is, any neighboring four magnet pieces 406 form a point-cusped magnetic field (hereinafter, called PCM) 411 on the target surface. The semiconductor manufacturing apparatus 100 can form the PCM in this manner and therefore sometimes called a PCM sputter apparatus or a PCM processing apparatus.

The height of the magnet piece 406 is typically larger than 2 mm and the cross-sectional shape thereof is rectangular or circular. The diameter, height, and material of the magnet piece 406 can be set optionally depending on process application. When high-frequency power is supplied to the upper electrode 401 of the semiconductor manufacturing apparatus 100, plasma is generated by way of a capacity-coupling type mechanism. This plasma is subjected to the action of the closed point-cusped magnetic field 411.

The magnetic field adjustment magnetic body 408 is extended so as to partially overlap the magnet piece 406 located on the outer perimeter side on the side of the target electrode 402. Thereby, the magnetic field strength can be suppressed (controlled) in the gap between the target electrode 402 and the shield 403. The magnetic field adjustment magnetic body 408 may be made of a material which can control the magnetic field strength between the target electrode 402 and the shield 403 and preferably made of a high-permeability material such as SUS430, for example. The magnet mechanism 405 can adjust the magnetic field by the adjustment of an area where the magnet piece 406 and the magnetic field adjustment magnetic body 408 overlap each other. That is, when the area where the magnet piece 406 and the magnetic field adjustment magnetic body 408 overlap each other is adjusted, it is possible to supply a magnetic field required for sputtering the target electrode 402 across the outermost perimeter of the target electrode 402 and to adjust the magnetic field strength in the gap between the target electrode 402 and the shield 403.

Back to FIG. 1, Reference numeral 420 indicates a control unit as a control means controlling the entire semiconductor manufacturing apparatus 100. This control unit 420 has a CPU performing processing operation such as various calculations, controls, and determinations and a ROM storing various control programs to be executed by this CPU. Further, the control unit 420 has a RAM, a non-volatile memory such as a flash memory and an SRAM, which temporarily store data under processing operation in CPU, input data, and the like. The control unit 420 having such a configuration is configured to control the upper electrode high-frequency power source 102, the DC power source 103, and the lower electrode high-frequency power source 305 so as to apply predetermined voltages to the upper electrode and the lower electrode, respectively. Further, the control unit 420 is configured to control the automatic pressure control mechanism 431 so as to obtain a predetermined pressure within the chamber 201. Moreover, the control unit 420 is configured to control the cooling/heating mechanism 412 so as to obtain a predetermined temperature for the substrate temperature.

FIGS. 3A and 3B are explanatory diagrams of particle transfer processes in low pressure sputtering and high pressure sputtering, and the shapes of sputtered films formed in trenches 453, respectively. As shown in FIG. 3A, in the low pressure sputtering, sputter particle scattering by collision does not occur until the sputter particles arrives at a substrate. Accordingly, a biased state of a sputtered film shape is caused between the substrate edge part 3001 of FIG. 3A and the substrate center part 3002 of FIG. 3A.

However, when sputtering is performed at a high pressure using the apparatus of the present embodiment in FIG. 1, the sputter particles 450 are spread within the container by the scattering caused by collision with process gas (argon gas in the present embodiment) until the sputter particles 450 arrive at the substrate 306, as shown in FIG. 3B. The sputter particles 450 spread by the scattering are accelerated by a sheath 451 formed around the substrate 306. In this manner, the sputter particles spread by the above scattering and accelerated by the sheath 451 are input onto the substrate 306 and thereby it is possible to deposit a sputtered film 452 having a highly symmetrical coverage shape in each of the tranches 453 on the whole substrate surface as indicated by Reference numerals 3003 and 3004 of FIG. 3B and further to suppress the deposition to the side wall. That is, in the present embodiment, the pressure is preferably made higher to cause the scattering of the sputter particle by the atmosphere gas to occur for allowing the sputter particles to enter uniformly the whole surface of the substrate 306. The sputter particle 450 generated from the target is diffused by the above scattering so as to enter uniformly the whole surface of the substrate 306 but, on the other hand, the energy thereof is also lost by the scattering. In the present embodiment, however, the sputter particle 450, the energy of which has been reduced, is accelerated to the substrate 306 by the action of the sheath 451 which is a region for accelerating the ion. Accordingly, it is possible to cause similar sputter particles 450 to enter vertically each of the trenches formed on the substrate 306. Here, Reference numeral 454 indicates a base substrate.

Figure 4:
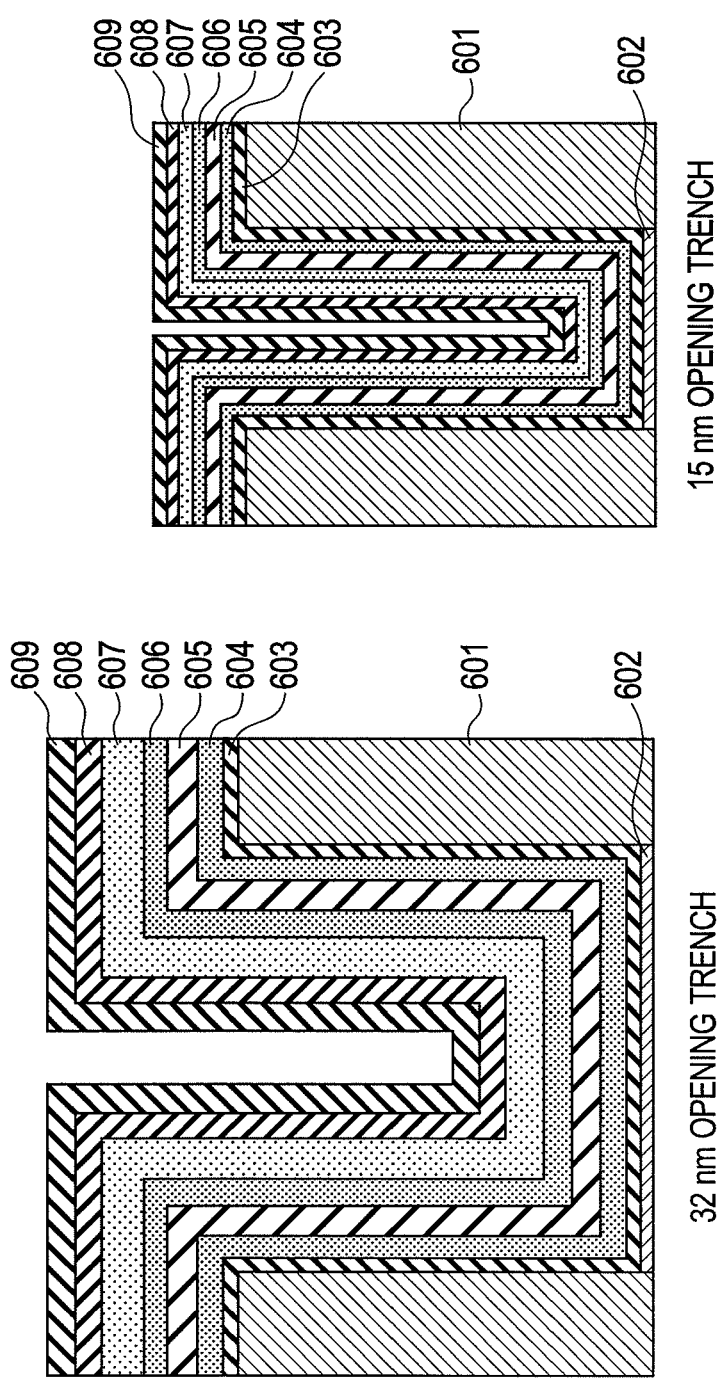
FIG. 4 is a schematic diagram showing trench size dependence in a gate last method when a conventional CVD method is used for a formation technique.

FIG. 4 shows an explanatory diagram of a gate last formation technique which stacks various kinds of material using a CVD method in each of the fine trench openings having opening diameters of 32 nm and 15 nm, respectively. A preliminarily formed underlayer insulating film 602 exists in the fine trench structure 601. A high-permittivity insulating film 603 is formed on the underlayer insulating film 602. Further, a metal nitride film A 604, a metal nitride film B 605, a metal nitride film C 606, and a metal film 607 are formed for controlling an operation voltage, and a stacked barrier film 608 and a Seed-Al film 609 are formed for embedding. When these various kinds of material are formed by the CVD method, while a film is formed uniformly not only on the bottom surface of the trench part but also on the side wall, the trench opening becomes narrower as the deposited film thickness is made larger, as apparent from FIG. 4. Accordingly, the opening is closed in a fine trench of 15 nm unless the thickness of each layer is made smaller. Therefore, it is not possible to form a film having a sufficiently large thickness in a case in which the barrier underlayer needs to have a larger thickness required for barrier properties.

Figure 5:
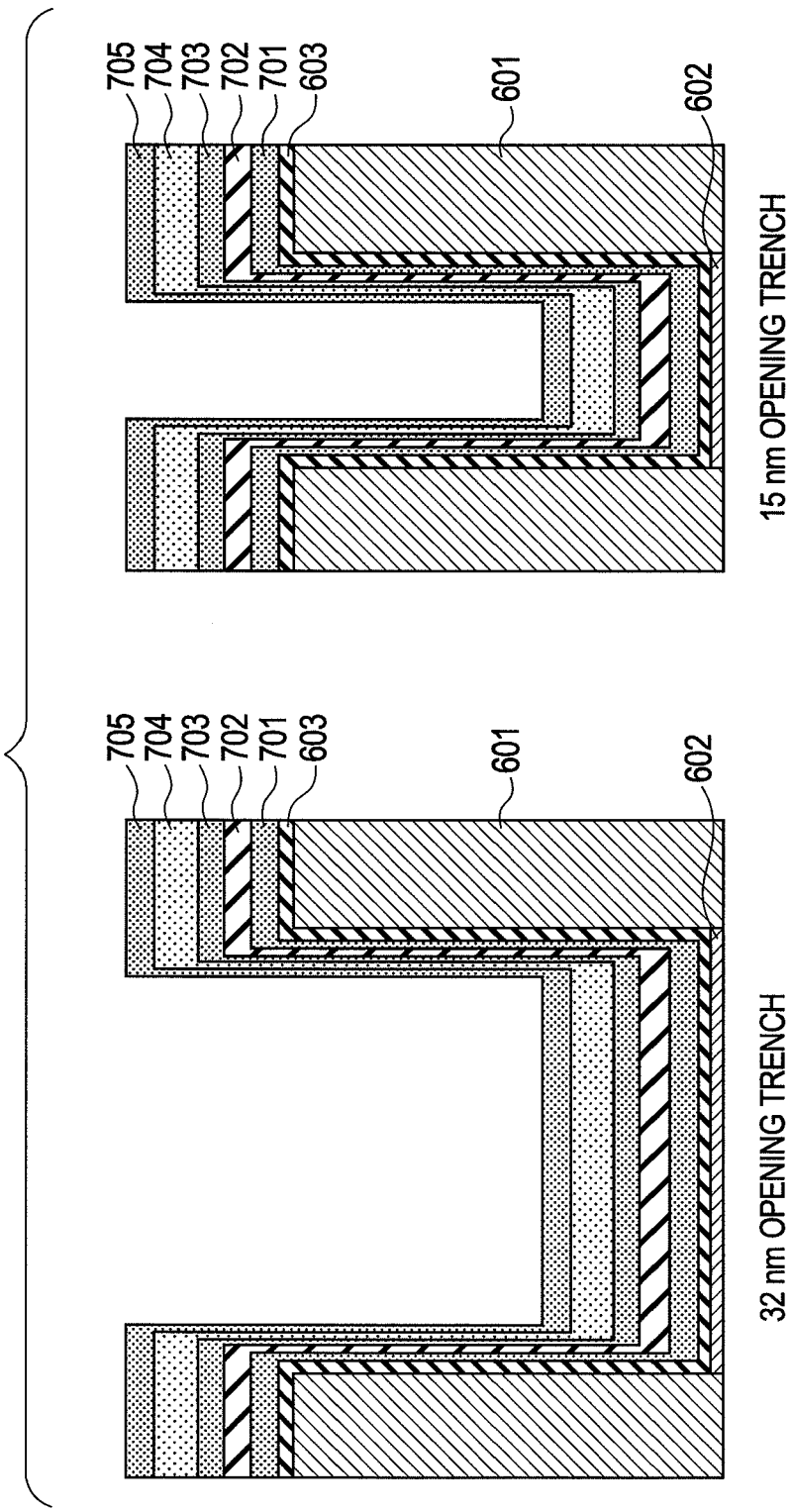
FIG. 5 is a schematic diagram showing trench size dependence in a gate last method when a PCM sputtering method according to an embodiment of the present invention is used for a formation technique.

Meanwhile, FIG. 5 shows an explanatory diagram of a gate last formation technique which stacks various kinds of material using the PCM sputter apparatus 100 shown in FIG. 1 of the present embodiment. A preliminarily formed underlayer insulating film 602 exists in a fine trench structure 601. A high-permittivity insulating film 603 is formed on the underlayer insulating film 602. Further, a metal nitride film A 701, a metal nitride film B 702, a metal nitride film C 703, and a metal film 704 are formed for controlling an operation voltage, and a single-layer barrier film 705 is formed for embedding. In the apparatus according to the present embodiment, the sheath is formed around the stage holder 302 as a substrate holder part (i.e., substrate 306 placed on the stage holder 302), and thereby the formation of the sputtered film can be suppressed on the side wall of the trench. Accordingly, as shown in FIG. 5, it is possible to form various kinds of material within the trench while suppressing the narrowing of the trench opening compared to the case of using the conventional CVD method shown in FIG. 4. Thereby, it is possible to form a film in the fine pattern of 15 nm even using the same thickness as that for the 32 nm trench. Accordingly, even when the trench size is further miniaturized, it is possible to form a film without changing the optimized film thickness of the various kinds of material. That is, the narrowing of the trench opening can be suppressed also for a trench having a narrow width even when the layer is formed having a larger thickness. Further, the barrier film according to the present embodiment uses a single-layer film and thereby the number of layers of the stacked structure can be reduced.

Figure 6:
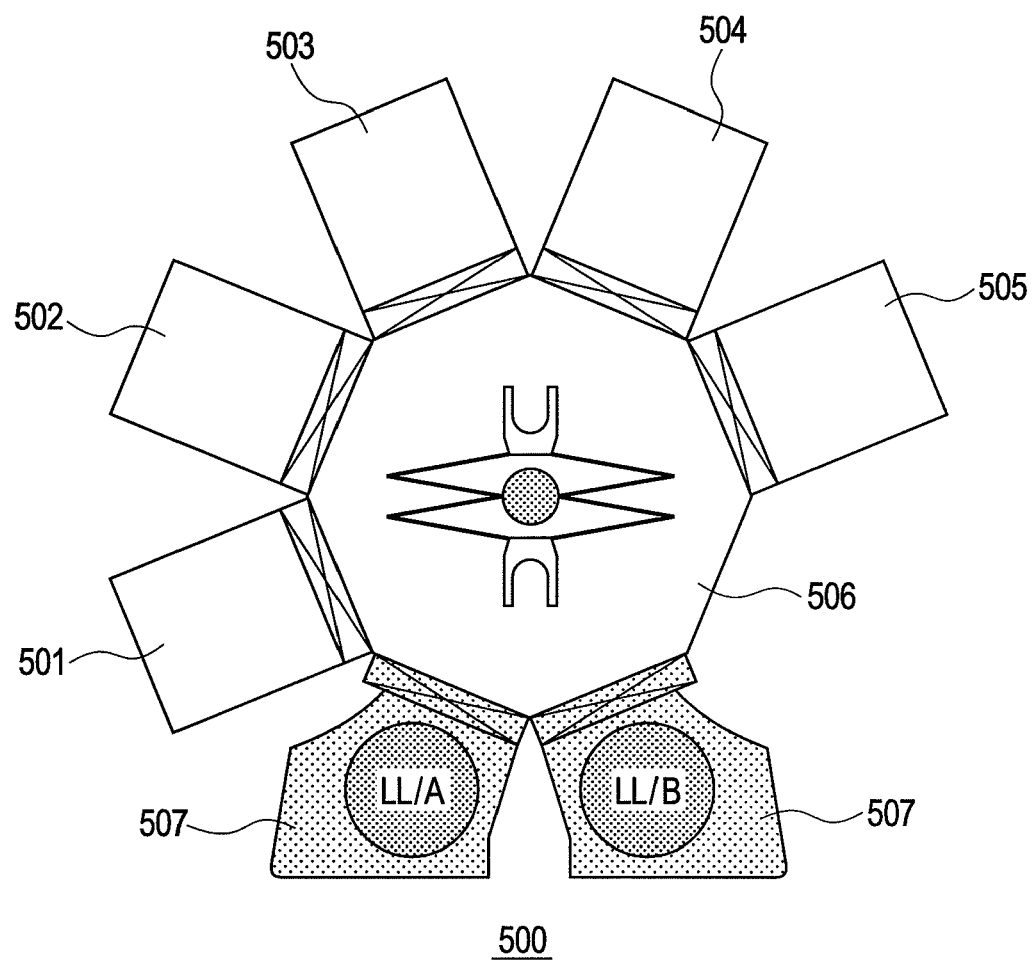
FIG. 6 is a diagram showing a configuration of a semiconductor manufacturing apparatus according to an embodiment of the present invention.

FIG. 6 shows a semiconductor manufacturing apparatus 500 according to the present embodiment which is used in an electronic component manufacturing method including a step of embedding a metal film in a concave part. The semiconductor manufacturing apparatus 500 includes a chamber 501 forming the titanium nitride film and a chamber 502 performing the Al embedding into a trench for the processing of the first step and the second step, respectively, and metal film formation chambers 503, 504, and 505 attached so as to deposit the other various kinds of metal material. Further, the semiconductor manufacturing apparatus 500 comprises a transfer chamber 506 which includes a vacuum transfer unit capable of transferring a substrate to each apparatus of the chambers 501 to 505 without exposing the substrate to the atmosphere, and a load lock chamber 507 for transferring the substrate from the atmosphere to vacuum. Note that each of the chambers 501, 502, 503, 504, and 505 is the PCM sputter apparatus (semiconductor manufacturing apparatus 100) shown in FIG. 1 according to the present embodiment. By using the present semiconductor manufacturing apparatus 500, it is possible to perform the processing continuously without exposing the substrate to the atmosphere and thereby it is possible to suppress the adsorption of impurities such as water, carbon, and oxygen to an interface. Thereby it is possible to transfer the substrate to the next step without changing the property of the film formed by each of the apparatuses.

Here, the semiconductor manufacturing apparatus 500 comprises a controller (not shown in the drawing) including an arithmetic processing unit such as a CPU, and carries out predetermined processing for a substrate to be processed by outputting an instruction signal to each of the processing apparatuses 501 to 507 according to a predetermined program. Note that each of the processing apparatuses 501 to 507 includes a control unit such as a PLC (Programmable Logic Controller) (not shown in the drawing; note that control unit in each of the processing apparatuses 501 to 505 is the control unit 420 explained in FIG. 1), and controls units such as a mass flow controller and an exhaustion pump according to the instruction signal output from the controller. Accordingly, in the corresponding chamber, the control unit 420 in FIG. 1 is configured to control the upper electrode high-frequency power source 102, the DC power source 103, the lower electrode high-frequency power source 305, the cooling/heating mechanism 412, the automatic pressure control mechanism 431 and the like, according to the various kinds of instruction signal received from the above controller.

FIGS. 7A and 7B show a conventional flow and a flow of the present embodiment, respectively, for the method of embedding a metal film into a trench. In the conventional Al embedding method, a stacked barrier film stacking Ti and TiN is formed in the trench for suppressing Al diffusion in the barrier film formation step 810. Subsequently, in the Seed-Al layer formation step 811, a Seed-Al layer is formed on the above stacked barrier film for accelerating Al migration. After that, in the Al embedding step 812, Al is formed on the stacked barrier layer under a high temperature environment to be embedded into the trench.

However, the Al embedding method according to the present embodiment can obtain perfect embedding characteristics even by performing the single-layer barrier film formation step 815 as the first step and performing the Al embedding formation step 816 as the second step directly on the single-layer barrier film without using the Seed-Al.

The deposition of a TiN single-layer barrier film in the first step 815 is performed in the chamber 501. A Ti metal target is used for the target and the Ti target is mounted on the target electrode 402 in the chamber 501. Each parameter is set at the following condition. That is, the control unit 420 of the chamber 501 controls the cooling/heating mechanism 412 to set the substrate temperature at 30° C. Further, the control unit 420 of the chamber 501 controls the upper electrode high-frequency power source 102 and the DC power source 103 of the chamber 501 to set the RF power and the DC voltage of the Ti target at 1,500 W and 430 V, respectively. Moreover, Ar is used for the inert gas, the supply amount of Ar is set at 70 sccm, the supply amount of nitrogen which is a reactive gas is set at 30 sccm, the Ar gas and the nitrogen gas are introduced from the gas introduction port 409 of the chamber 501, the pressure within the chamber is set at 10 Pa by the automatic pressure control mechanism 431 of the chamber 501, and then the film formation is performed. Further, for controlling a film formation shape, the control unit 420 of the chamber 501 controls the lower electrode high-frequency power source 305 of the chamber 501 to set the RF power of the lower electrode 301, which is the substrate electrode, at 50 W and then performs the film formation.

Moreover, the deposition of a Ti single-layer barrier film is performed for comparison with a single barrier layer material. In the deposition of the Ti single-layer barrier film, the substrate temperature is set at 30° C., the RF power and the DC voltage of the Ti target are set at 1,500 W and 430 V, respectively, Ar is used for the inert gas, the supply amount of Ar is set at 100 sccm, the pressure within the chamber is set at 10 Pa by the automatic pressure control mechanism, and then the film formation is performed. Further, for the control of the film formation shape, the film formation is performed by setting the RF power of the substrate electrode at 50 W.

Note that, while the target containing Ti is used in the present embodiment, a target containing TiN may be used. In this case, inert gas may be used as the gas to be introduced from the gas introduction port 409.

In this manner, in the first step, the control unit 420 of the chamber 501 generates plasma around the target to generate the sputter particle from the target, and controls the upper electrode high-frequency power source 102 so that the TiN single-layer barrier film is formed with the sputter particle within the trench formed on the substrate 306 which is an object to be processed, and also controls the automatic pressure control mechanism 431 to cause the automatic pressure control mechanism 431 to operate so as to obtain a predetermined pressure within the chamber 501.

Next, in the second step 816, the trench is filled with the low-melting-point metal (here, Al) under a temperature condition allowing the low-melting-point metal to flow. The deposition of Al in the second step 816 is performed in the chamber 502. An Al metal target is mounted on the target electrode 402 of the chamber 502. Each parameter is set at the following condition as an example. That is, the control unit 420 of the chamber 502 controls the cooling/heating mechanism 412 to set the substrate temperature at 400° C. Further, the control unit 420 of the chamber 502 controls the upper electrode high-frequency power source 102 and the DC power source 103 of the chamber 502 to set the RF power and the DC voltage of the Al target at 3,000 W and 100 V, respectively. Moreover, Ar is used for the inert gas, the supply amount of Ar is set at 100 sccm, Ar gas is introduced from the gas introduction port 409 of the chamber 502, the pressure within the chamber is set at 10 Pa by the automatic pressure control mechanism 431 of the chamber 502, and then the film formation is performed. Further, for increasing the amount of the deposited film thickness onto the trench bottom part, the control unit 420 of the chamber 502 controls the lower electrode high-frequency power source 305 of the chamber 502 to set the RF power of the lower electrode 301, which is the substrate electrode, at 200 W and then performs the film formation. Here, the frequency of the high-frequency power source is preferably set at a frequency between 10 and 100 MHz. Further preferably, the frequency is a frequency between 40 and 60 MHz for the purpose of forming high density plasma using the point-cusped magnetic field at the above pressure.

In this manner, in the second step, the control unit 420 of the chamber 502 generates plasma around the target to generate the sputter particle from the target, and controls the upper electrode high-frequency power source 102 so that the Al film is formed with the sputter particle within the trench formed on the substrate 306 which is an object to be processed and also controls the cooling/heating mechanism 412 so as to obtain a substrate temperature at which Al can flow.

Figure 8A:
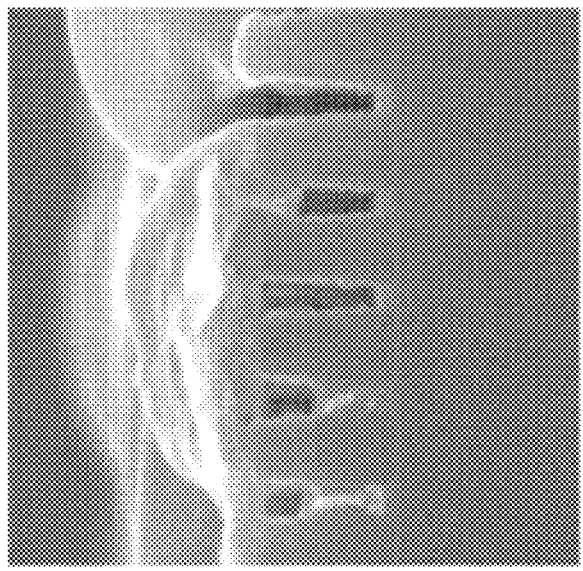
FIGS. 8A and 8B are diagrams showing single-underlayer material dependence of an Al embedding characteristic according to an embodiment of the present invention.
Figure 8B:
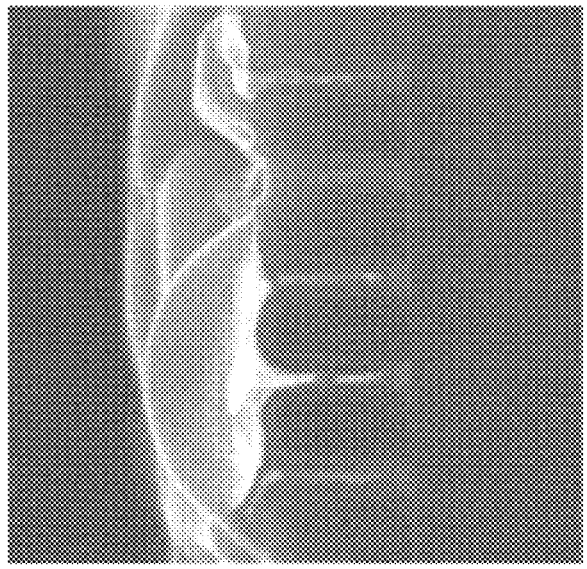

FIGS. 8A and 8B are diagrams showing a result of confirming the Al embedding characteristic for the case of using the PCM sputter apparatus shown in FIGS. 1 and 6 according to the present embodiment. The Al embedding characteristic was evaluated by the analysis of SEM (Secondary Electron Microscopy). FIG. 8A is a diagram showing a result of a case in which a Ti single-layer barrier film was deposited to have a thickness of 10 nm in the Ti single-layer barrier film formation of the first step and then the Al embedding of the second step was performed. FIG. 8B shows a result of a case in which a TIN single-layer barrier film was deposited to have a thickness of 10 nm in the TiN single-layer barrier film formation of the first step and then the Al embedding of the second step was performed. In FIG. 8A, the Al embedding into the trench part is not completed and many hollow spaces (hereinafter, called voids) are observed. On the other hand, in FIG. 8B, the Al embedding into the trench part is completed and the generation of the void is not observed. Probably this is because, in the Ti single-layer barrier film, reaction between Ti and Al occurs in the Al embedding and alloying is accelerated to suppress Al migration. Accordingly, this shows that the alloying can be suppressed in the Al embedding and the Al migration can be accelerated, by the use of the TiN single-layer barrier film of the present embodiment.

FIG. 9A is a diagram showing a result of a case in which a TiN single-layer barrier film was formed to have a thickness of 10 nm in the TiN single-layer barrier film formation of the first step and then the Al embedding of the second step was performed after exposure to the atmosphere. FIG. 9B is a diagram showing a result of a case in which a TiN single-layer barrier film was formed to have a thickness of 10 nm in the TIN single-layer barrier film formation of the first step and a TiN single-layer barrier film was formed again to have a thickness of 10 nm in the TiN single-layer barrier film formation of the first step after exposure to the atmosphere, and then the Al embedding of the second step was performed without exposure to the atmosphere. FIG. 9C is a diagram showing a result of a case in which a TiN single-layer barrier film was formed to have a thickness of 10 nm in the TiN single-layer barrier film formation of the first step and then the Al embedding of the second step was performed without exposure to the atmosphere.

In FIG. 9A, the Al embedding into the trench part is not completed and the void is observed. In FIG. 9B, the trench part is observed to have a better embedding than that of FIG. 9A but the void is caused. In 9C, Al is embedded completely into the trench part and the generation of the void is not observed. Probably this is because the TIN film was exposed to the atmosphere and contamination of water and carbon from the atmosphere was caused in the exposure to the atmosphere to prevent the Al migration in the Al film formation at a high temperature. Accordingly, when the first step and the second step are performed using different vacuum containers, respectively, it is preferable to perform the transfer and the processing without exposure to the atmosphere.

Figure 10E:
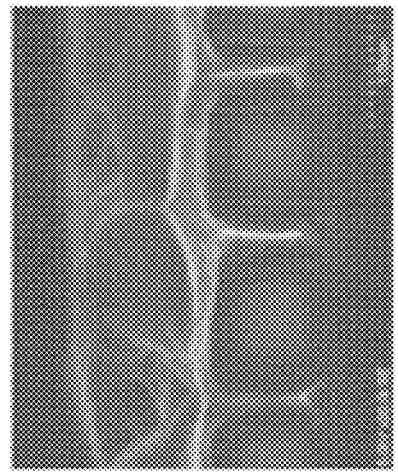
FIGS. 10A to 10E are diagrams showing processing apparatus dependence of Al embedding characteristic according to an embodiment of the present invention.
Figure 10B:
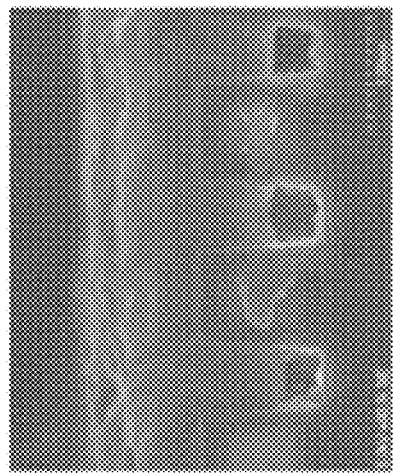
Figure 10D:
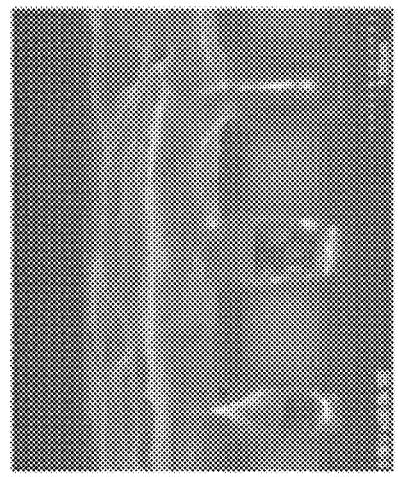
Figure 10A:
Figure 10C:
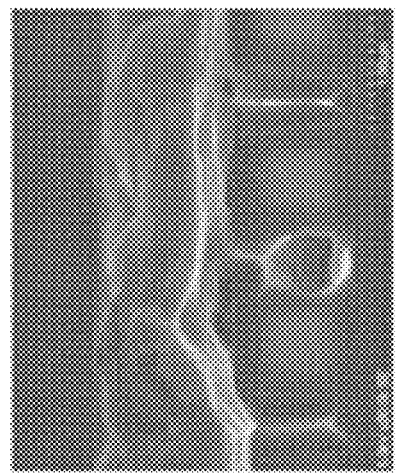

Next, FIGS. 10A to 10G show a result of comparison study using a typically-used magnetron sputter apparatus (hereinafter, called STD) for the first step and the second step. FIG. 10A is a diagram showing a result of a case in which a TiN single-layer barrier film was formed to have a thickness of 10 nm as the first step in the STD apparatus at a substrate temperature of the room temperature and at a pressure of 10 Pa and the Al embedding was performed as the second step in the STD apparatus at a substrate temperature of 400° C. In this case, the Al embedding into the trench part is not completed and the void is observed. FIG. 10B is a diagram showing a result of a case in which a TiN single-layer barrier film was formed to have a thickness of 10 nm as the first step in the processing apparatus according to the present embodiment (e.g., semiconductor manufacturing apparatus 100 as the PCM processing apparatus) at a substrate temperature of the room temperature and at a pressure of 10 Pa and the Al embedding was performed as the second step in the STD apparatus at a substrate temperature of 400° C. In this case, the Al embedding is more successfully completed than that of FIG. 10A but the void is caused at the trench bottom part. FIG. 10C is a diagram showing a result of a case in which a TiN single-layer barrier film was formed to have a thickness of 10 nm as the first step in the PCM processing apparatus according to the present embodiment at a substrate temperature of the room temperature and at a pressure of 10 Pa and the Al embedding was performed as the second step in the processing apparatus according to the present embodiment at a substrate temperature of 400° C. In this case, the Al embedding characteristic is improved compared to that of FIG. 10B but the generation of the void is observed.

FIG. 10D is a diagram showing a result of a case in which a TiN single-layer barrier film was formed to have a thickness of 10 nm as the first step in the PCM processing apparatus according to the present embodiment at a substrate temperature of 400° C. and at a pressure of 10 Pa and the Al embedding was performed as the second step in the processing apparatus according to the present embodiment at a substrate temperature of 400° C. In this case, the generation of the void is observed similarly to the case of FIG. 10C even at a TiN film formation temperature of 400° C. FIG. 10E is a diagram showing a result of a case in which a TiN single-layer barrier film was formed to have a thickness of 10 nm as the first step in the PCM processing apparatus according to the present embodiment at a substrate temperature of the room temperature and at a pressure of 100 Pa and the Al embedding was performed as the second step in the processing apparatus according to the present embodiment at a substrate temperature of 400° C. In this case, the Al embedding into the trench part is perfectly completed and the generation of the void is not observed.

Figure 11:
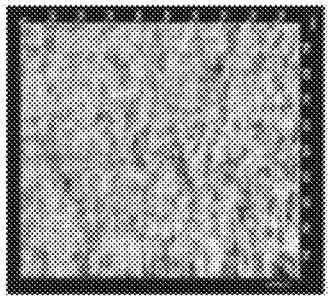
FIG. 11 is a diagram showing processing apparatus dependence of an AFM measurement result for a TiN single-layer barrier film according to an embodiment of the present invention.

Next, a result of a study about the TiN single-layer barrier film in the first step will be explained. FIG. 11 is a diagram showing a result of analysis for the surface roughness (Ra) of a TiN single-layer barrier film by an AFM (Atomic Force Microscopy) method. As shown in FIG. 11, while the surface roughness (Ra) is 0.479 nm for a TiN single-layer barrier film deposited by the use of the STD processing apparatus at the room temperature and at a pressure of 10 Pa, the surface roughness (Ra) is 0.162 nm for a TiN single-layer barrier film deposited by the use of the PCM processing apparatus according to the present embodiment at the room temperature and at a pressure of 10 Pa and flatness is found to be better. Further, the surface roughness (Ra) is 0.091 nm for a TIN single-layer barrier film deposited by the use of the PCM processing apparatus according to the present embodiment at a substrate temperature of 400° C. and at a pressure of 10 Pa and the flatness is found to be improved compared to the case of the deposition at the room temperature. Moreover, the surface roughness (Ra) is found to be the smallest as 0.073 nm for a TiN single-layer barrier film deposited by the use of the PCM processing apparatus according to the present embodiment at a substrate temperature of the room temperature and at a pressure of 100 Pa. Generally the surface migration of a metal element is better as the surface roughness is smaller. However, the improvement of the Al embedding characteristic is not found between FIG. 10C and FIG. 10D and the influence of the flatness would be small. Further, in order to reduce the surface roughness of the TiN single-layer barrier film, the pressure within the vacuum container in the first step is preferably not lower than 1 Pa and not higher than 200 Pa, and more preferably not lower than 10 Pa and not higher than 100 Pa.

Figure 12B:
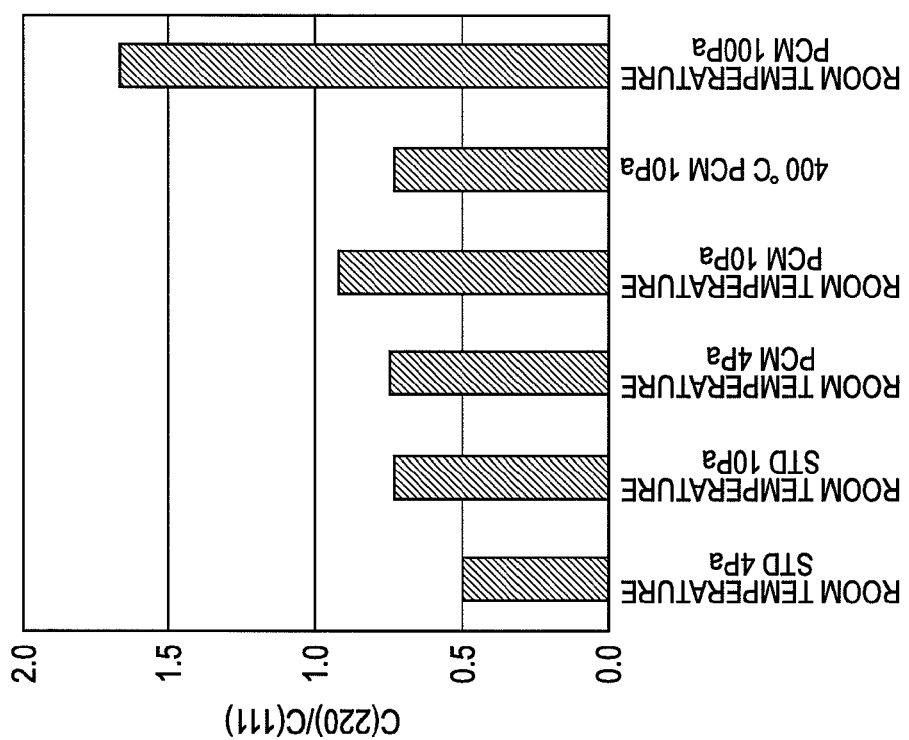
FIG. 12B is a diagram showing a peak intensity ratio of C(220) orientation normalized by a peak intensity of C(111) orientation for each condition according to the result of FIG. 12A.
Figure 12A:
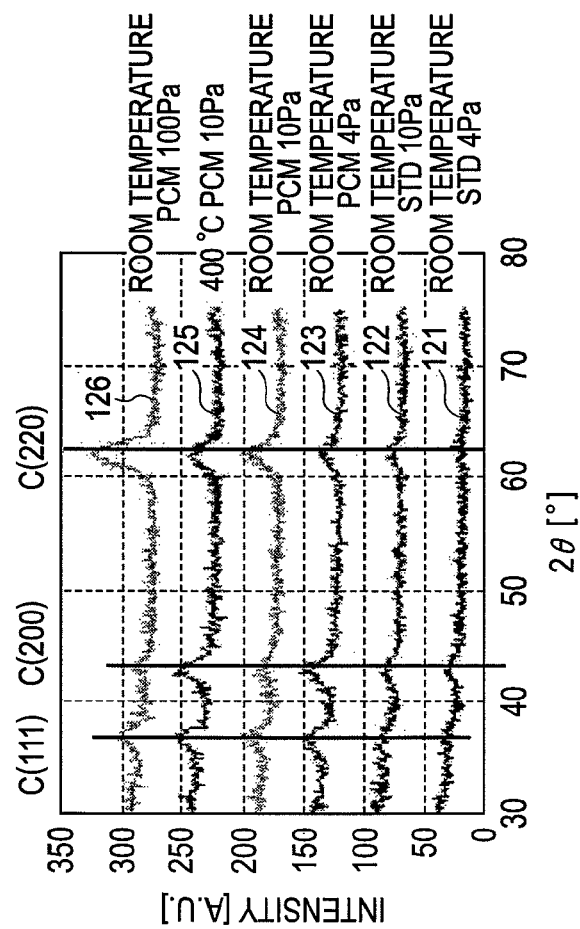
FIG. 12A is a diagram showing processing apparatus dependence of an XRD measurement result for a TiN single-layer barrier film according to an embodiment of the present invention.

Next, a result of a study about the crystalline orientation of the TiN single-layer barrier film in the first step will be explained. FIG. 12A is a diagram showing a result of the analysis for the crystalline orientation in a TiN single-layer barrier film by an XRD (X-ray Diffraction) method for each condition. In FIGS. 12A and 12B, "Room temperature STD 4 Pa" indicates a case in which a TiN single-layer barrier film was formed into the trench by the use of the STD processing apparatus at a substrate temperature of the room temperature and at a pressure of 4 Pa and Plot 121 shows an XRD measurement result for the film formed under this condition. "Room temperature STD 10 Pa" indicates a case in which a TiN single-layer barrier film was formed into the trench by the use of the STD processing apparatus at a substrate temperature of the room temperature and at a pressure of 10 Pa and Plot 122 shows an XRD measurement result for the film formed under this condition. "Room temperature PCM 4 Pa" indicates a case in which a TiN single-layer barrier film was formed into the trench by the use of the PCM processing apparatus according to the present embodiment at a substrate temperature of the room temperature and at a pressure of 4 Pa and Plot 123 shows an XRD measurement result for the film formed under this condition. "Room temperature PCM 10 Pa" indicates a case in which a TiN single-layer barrier film was formed into the trench by the use of the PCM processing apparatus according to the present embodiment at a substrate temperature of the room temperature and at a pressure of 10 Pa and Plot 124 shows an XRD measurement result for the film formed under this condition. "400° C. PCM 10 Pa" indicates a case in which a TiN single-layer barrier film was formed into the trench by the use of the PCM processing apparatus according to the present embodiment at a substrate temperature of 400° C. and at a pressure of 10 Pa and Plot 125 shows an XRD measurement result for the film formed under this condition. "Room temperature PCM 100 Pa" indicates a case in which a TiN single-layer barrier film was formed into the trench by the use of the PCM processing apparatus according to the present embodiment at a substrate temperature of the room temperature and at a pressure of 100 Pa and Plot 126 shows an XRD measurement result for the film formed under this condition.

As shown in FIG. 12A, it is found that the TiN single-layer barrier film deposited by the use of the STD processing apparatus has weaker C(111), C(200), and C(220) orientations than the TiN single-layer barrier film deposited by the use of the PCM processing apparatus according to the present embodiment. The peak intensity ratio of this C(220) orientation normalized by the peak intensity of the C(111) orientation is shown in FIG. 12B. From this result, the TiN single-layer barrier film deposited by the use of the STD processing apparatus has a C(220)/C(111) ratio of approximately 0.5 to 0.7 which is smaller than that of the TiN single-layer barrier film deposited by the use of the PCM processing apparatus according to the present embodiment. The crystalline orientations are equivalent between the case in which the TiN single-layer barrier film was deposited at a substrate temperature of the room temperature and at a pressure of 10 Pa and the case in which the TiN single-layer barrier film was deposited at a substrate temperature of 400° C. and a pressure of 10 Pa, both by the use of the PCM processing apparatus according to the present embodiment.

Further, it is found that the C(220)/C(111) ratio is maximized when the deposition was performed by the use of the PCM processing apparatus according to the present embodiment at a substrate temperature of the room temperature and at a pressure of 100 Pa. From this result and the result of FIG. 10E, probably a better C(220) orientation of the TiN single-layer barrier film improves the Al embedding characteristic. From this conclusion, the crystallinity of the TiN single-layer barrier film is preferably to show a C(220)/C(111) ratio of 0.7 or larger. Further, the pressure within the vacuum container of the first step is preferably not lower than 1 Pa and not higher than 200 Pa and more preferably not lower than 10 Pa and not higher than 100 Pa, for the purpose of obtaining a better crystalline orientation of the TiN single-layer barrier film.

Further, when the crystalline orientation of the TiN single-layer barrier film is weak, sometimes the barrier properties are degraded and Al is diffused to a layer lower than the TiN film of the barrier layer in the Al embedding of the second step. Thereby, MOSFET characteristic degradation occurs in the MOSFET electrode formation.

By forming the TiN single-layer barrier film by using the PCM processing apparatus at a pressure within the chamber not lower than 1 Pa and not higher than 200 Pa, and preferably not lower than 10 Pa and not higher than 100 Pa, the present embodiment can improve the C(220) crystalline orientation of the TiN single-layer barrier film formed within the trench. Accordingly, it is possible to preferably embed Al into the trench in which the TiN single-layer barrier film is formed while reducing the formation of the void and also to suppress the diffusion of the embedded Al into an underlayer of the TiN single-layer barrier film.

As described above, in the present embodiment, it is important to use the PCM processing apparatus as shown in FIG. 1, for example, and also to preferably increase the pressure within the chamber, for improving the C(220) crystalline orientation. That is, as shown in FIG. 12B, it is found that the PCM processing apparatus can improve the C(220) orientation also when the cases of forming the TiN single-layer barrier film are compared at the same pressure between the STD processing apparatus and the PCM processing apparatus (comparison between Plot 121 and Plot 123 and comparison between Plot 122 and Plot 124). Further, it is found that a higher pressure can cause the C(220) orientation to be improved when the cases of changing the pressure are compared in the case of using the same PCM processing apparatus (comparison among Plot 123, Plot 124, and Plot 126). In this manner, the present embodiment can improve the C(220) orientation of the TiN single-layer barrier film formed within the trench by using the PCM processing apparatus in the formation of the TiN single-layer barrier film and also setting the pressure of the chamber at a higher value (not lower than 1 Pa and not higher than 200 Pa, preferably not lower than 10 Pa and not higher than 100 Pa).

Figure 13:
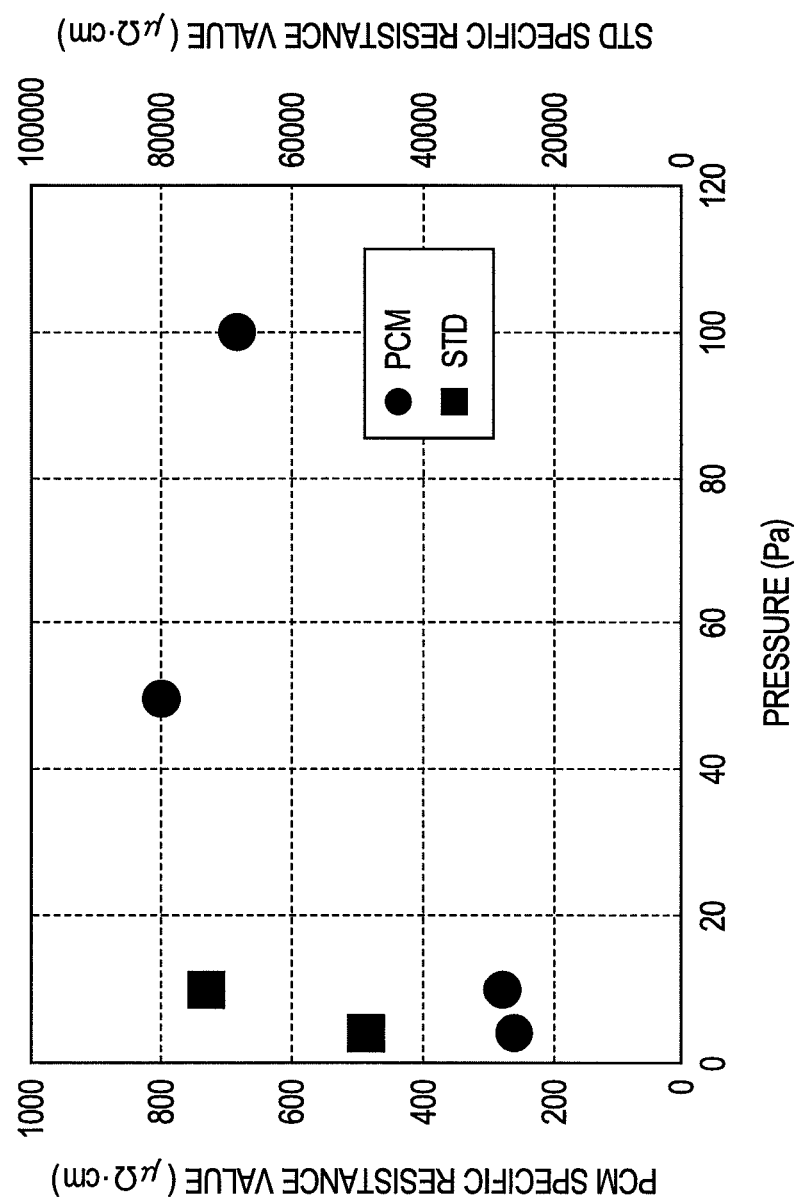
FIG. 13 is a diagram showing processing apparatus dependence of specific resistance in a TiN single-layer barrier film according to an embodiment of the present invention.

Further, as shown in FIG. 13, the TiN single-layer barrier film formed by the STD processing apparatus has a high specific resistance value. When the specific resistance is high, the contact resistance with an electrode film becomes high and the degradation of the MOSFET characteristic such as degradation in power consumption occurs. Meanwhile, it is found that the TiN single-layer barrier film formed by the PCM processing apparatus according to the present embodiment, while having higher specific resistance values at the pressure of 50 Pa and 100 Pa, respectively, has a lower value than that in the case of the STD processing apparatus at a lower pressure. Probably this is because, when the high pressure film formation is performed in the STD processing apparatus, a collision rate between the sputter particle and the atmospheric gas is increased to cause insufficient activation and energy necessary for the crystallization and reaction is lost. However, in the PCM processing apparatus according to the present embodiment, high-density plasma is formed by the PCM and the sufficiently activated sputter particle can be caused to reach the substrate surface even when the collision rate between the sputter particle and the atmospheric gas is increased. Accordingly, probably it is possible to form the TiN single-layer barrier film having a preferable crystallinity while not increasing the resistance value or suppressing the increase of the resistance value.

FIG. 14A is a diagram showing a result of a study about pressure dependence in a ratio of a film thickness deposited to the trench bottom part to a film thickness deposited to the trench upper part for the TiN single-layer barrier film when the deposition of the TiN single-layer barrier film of the first step was performed in the STD processing apparatus and the PCM processing apparatus according to the present embodiment. FIG. 14B is a diagram showing a result of a study about pressure dependence in a ratio of a film thickness deposited to the trench side wall part to a film thickness deposited to the trench upper part for the TiN single-layer barrier film when the deposition of the TiN single-layer barrier film of the first step was performed in the STD processing apparatus and the PCM processing apparatus according to the present embodiment. From FIG. 14A, it is confirmed that the deposited film thickness ratio (bottom coverage ratio) of the trench bottom part is not found to increase even when the pressure is increased in the STD apparatus, and the deposited film thickness ratio of the trench bottom part, while being 40% at a pressure of 4 Pa, significantly increases to 60% or higher when the pressure is increased to 10 Pa or higher in the PCM processing apparatus according to the present embodiment. Further, for increasing the deposited film thickness of the trench bottom part, the pressure is preferably not lower than 10 Pa and not higher than 100 Pa. Moreover, from FIG. 14B, the deposited film thickness ratios at the trench side wall part (side coverage ratios) are equivalent between the both apparatuses. From this result, the result of FIGS. 10A to 10E can be discussed as follows.

Figure 15A:
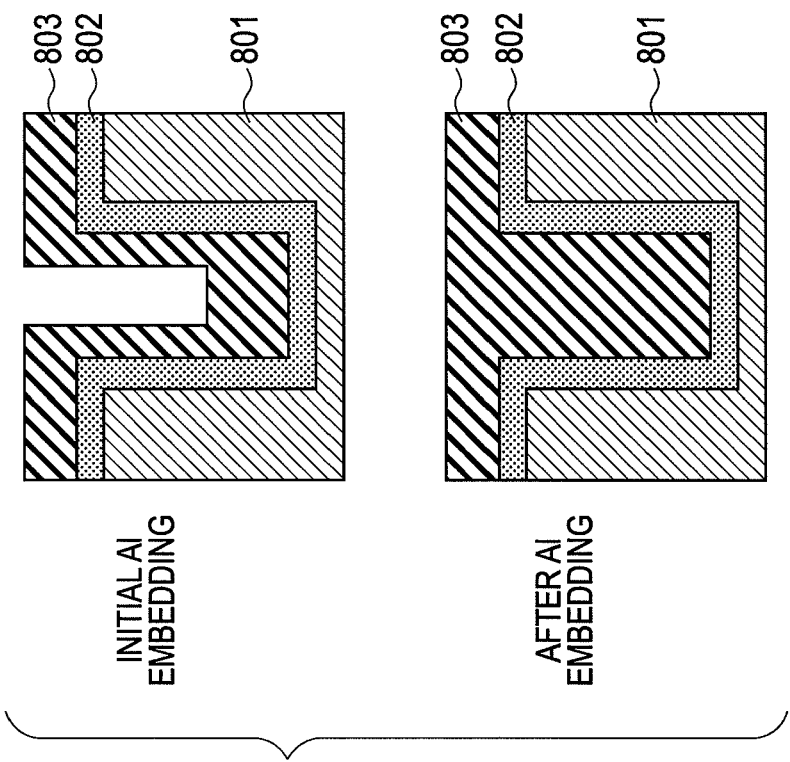
FIGS. 15A and 15B are schematic diagrams each showing Al embedding characteristic of a processing apparatus according to an embodiment of the present invention.
Figure 15B:
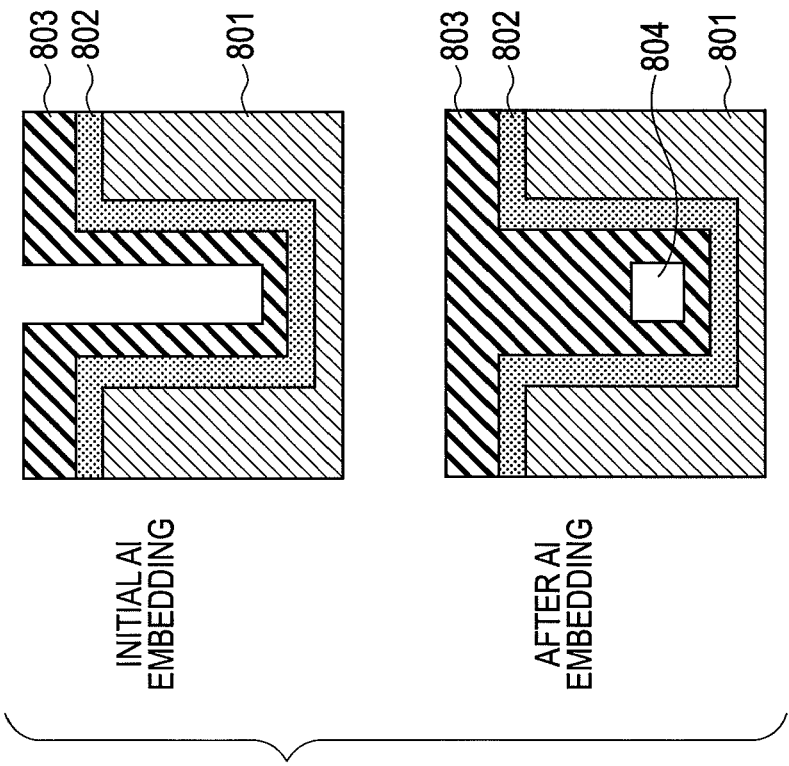

FIGS. 15A and 15B are schematic diagrams for explaining the case of depositing the single-layer TiN barrier film 802 into the trench structure 801 in the first step and performing the Al embedding 803 in the second step. Specifically, FIG. 15A is a diagram for explaining the case of depositing the TiN single-layer barrier film in the PCM processing apparatus according to the present embodiment and performing the Al embedding in the STD processing apparatus, and FIG. 15B is a diagram for explaining the case of depositing the TiN single-layer barrier film in the PCM processing apparatus according to the present embodiment and performing the Al embedding in the PCM processing apparatus. As shown in FIG. 15A, in the case of using the STD processing apparatus in the Al embedding of the second step, probably the film thickness of Al formed on the trench bottom part is small and thereby the Al embedding cannot be performed sufficiently when Al migrates from above and the void 804 is generated. On the other hand, as shown in FIG. 15B, when the PCM processing apparatus according to the present embodiment is used, probably the film thickness of Al formed on the trench bottom part is large and also Al migrates from above, and thereby the perfect Al embedding can be performed. Further, for the purpose of increasing the amount of the film formation on the trench bottom part, the pressure within the vacuum container in the first step and the second step is preferably not lower than 1 Pa and not higher than 200 Pa, and more preferably, not lower than 10 Pa and not higher than 100 Pa.

EXAMPLE 1

A first example of the present invention will be explained with reference to the drawings.

FIG. 15B is a diagram showing the process that the TiN single-layer barrier film is formed into the trench structure in the first step and Al is embedded in the second step by the use of the PCM sputter apparatus shown in FIG. 1 and FIG. 6 according to an embodiment of the present invention, as described above. First, a TiN single-layer barrier film 802 was deposited into a trench structure 801 as the first step. A Ti metal target was used for the target and argon gas and nitrogen were used for the sputter gas. Next, the Al embedding was performed on the TiN single-layer barrier film 802 as the second step. An Al metal target was used for the target and argon was used for the sputter gas.

The substrate temperature, the target power, the sputter gas pressure, the Ar gas flow amount, and the nitrogen gas flow amount can be determined optionally in ranges of 25° C. to 500° C., 100 W to 5,000 W, 1 Pa to 200 Pa, 10 sccm to 500 sccm, and 1 sccm to 100 sccm, respectively.

The deposition of the TiN single-layer barrier film 802 in the first step was performed under the condition of using a Ti metal target, setting the substrate temperature at 30° C., setting the RF power and DC voltage of the Ti target at 1,500 W and 430 V, respectively, using Ar for the inert gas, setting the Ar supply amount at 70 sccm, setting the supply amount of nitrogen which is a reactive gas at 30 sccm, and setting the pressure within the chamber at 10 Pa using the automatic adjustment unit, and then the film formation was performed.

Further, for the purpose of controlling the deposited film shape, the deposition was performed by setting the RF power of the substrate electrode at 50 W. The TiN film was formed in a thickness range of 3 nm to 10 nm in the above formation step. Next, the deposition of Al 803 in the second step was performed under the condition of setting the substrate temperature at 400° C., setting the RF power and DC voltage of the Al target at 3,000 W and 100 V, respectively, using Ar for the inert gas, setting the Ar supply amount at 100 sccm, and setting the pressure within the chamber at 10 Pa using the automatic adjustment unit, and then the film formation was performed. Further, for the purpose of increasing the amount of the film thickness deposited on the trench bottom part, the film formation was performed by setting the RF power of the substrate electrode at 200 W.

EXAMPLE 2

Example Applied to the Gate Last Method

In the following, a second example of the present invention will be explained with reference to the drawings. Each of the diagrams of Step 161 to Step 166 in FIG. 16 shows steps of a semiconductor device manufacturing method which is the second example of the present invention. In the present example, for each of a region of a first region where an N-type MOSFET is to be formed and a region of a second region where a P-type MOSFET is to be formed, the deposition of the TIN single-layer barrier film of the first step and the Al embedding of the second step in the above embodiment are performed and metal gate electrodes are formed to realize respectively suitable effective work functions.

In Step 161 of FIG. 16, a trench structure 901 and a trench structure 902 are formed in the first region where the N-type MOSFET is to be formed and the second region where the P-type MOSFET is to be formed, respectively, and metal nitride films A 900 are formed in the trench structures 901 and 902, respectively. Next, in Step 162 of FIG. 16, a metal nitride film B 903 and a metal alloy film 904 are formed so as to cover the respective insides of the trench structures 901 and 902 by the use of the PCM sputter processing apparatus according to an embodiment of the present invention. Next, in Step 163 of FIG. 16, the metal nitride film B 903 and the metal alloy film 904, which compose the bottom part of the trench structure 901 in the first region where the N-type MOSFET is to be formed, are removed by the use of a lithography technique and an etching technique. In the present example, the metal nitride film B 903 was removed by wet etching using a mixed solution of sulfuric acid, hydrogen peroxide solution, and water, and the metal alloy film 904 was removed by Ar plasma etching.

Next, in Step 164 of FIG. 16, the substrate was transferred to the chamber 501 and a TiN single-layer barrier film 905 was formed so as to cover the respective insides of the trench structures 901 and 902 in the semiconductor manufacturing apparatus shown in FIG. 6 which can carry out the sputtering method according to an embodiment of the present invention (first step according to an embodiment of the present invention).

Next, in Step 165 of FIG. 16, the substrate on which the TiN single-layer barrier film was formed in the trench structures 901 and 902 was transferred to the chamber 502 and the Al embedding of the second step according to an embodiment of the present invention was performed to form a metal film 906 as Al within the trench structures 901 and 902. After that, in Step 166 of FIG. 16, planarization was performed by the use of a CMP technique and the unnecessary metal film 906 was removed.

Note that, in the step of forming the metal film made of Al, by setting the substrate temperature between 300° C. to 400° C., the metal alloy film 904 is diffused at least in the metal nitride film A 900 in the region where the N-type MOSFET is to be formed and the effective work function suitable for the N-type MOSFET can be realized. On the other hand, in the region where the P-type MOSFET is to be formed, the metal nitride film B 903 and the metal alloy film 904 suppress the Al diffusion and thereby it is possible to maintain an effective work function suitable for the P-type MOSFET. A study result of this effective work function of the P-type MOSFET is shown in FIG. 17.

Figure 17:
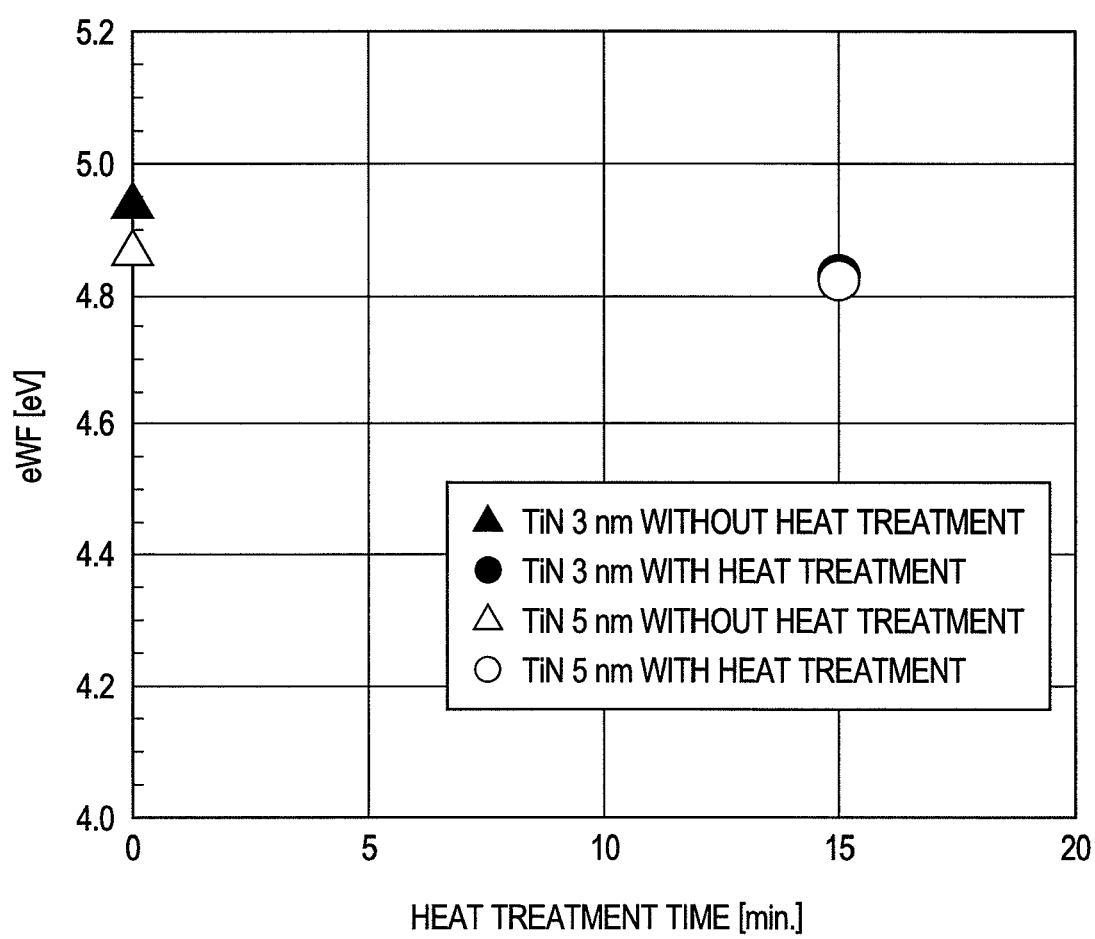
FIG. 17 is a diagram showing a study result of an effective work function in a P-type MOSFET manufactured by the manufacturing method of FIG. 16.

FIG. 17 is a diagram showing the study result of the respective effective work functions immediately after the Al embedding formation and after additional heat treatment of 450° C. in the step after the above stacking step of the various metal materials has been completed. Here, the evaluation was performed for TiN single-layer barrier film thicknesses of 3 nm and 5 nm. While the effective work function is known to be reduced when Al is diffused into the TIN single-layer barrier film, a significant reduction of the effective work function is not found even when heating is performed at 450° C. as shown in FIG. 17. This shows that the TiN single-layer barrier film formed by the use of the PCM processing apparatus according to an embodiment of the present invention has good barrier properties against the Al diffusion. As a result of the measurement of the effective work function, the EOT, and a leak current characteristic of the fabricated element, it was confirmed that the effective work function suitable for each MOSFET (4.4 eV or smaller for the N-type MOSFET and 4.6 eV or larger for the P-type MOSFET) was obtained without inviting the increase of the EOT by the use of the Al embedding method in an embodiment of the present invention.

What is claimed is:

1. An electronic component manufacturing method of gate last method having a first step of forming a high-permittivity insulating film in a trench formed on an object to be processed; and a second step of forming a metal nitride film for controlling an operation voltage on the high-permittivity insulating film, the method comprising:
   a third step of depositing, at room temperature, a single barrier film including titanium nitride on the metal nitride film for controlling the operation voltage by a sputtering method while forming a cusped magnetic field on a target surface, wherein a surface roughness of the single barrier film is less than 0.479 nm; and
   a fourth step of filling a low-melting-point metal film directly on the single barrier film under a temperature condition allowing the low-melting-point metal film to flow.

2. The electronic component manufacturing method of gate last method according to claim 1, wherein the fourth step deposits the low-melting-point metal film by a sputtering method while forming the cusped magnetic field on the target surface.

3. The electronic component manufacturing method of gate last method according to claim 1, wherein the third step is performed at a pressure not lower than 1 Pa and not higher than 200 Pa.

4. The electronic component manufacturing method of gate last method according to claim 1, wherein the third step is performed at a pressure not lower than 10 Pa and not higher than 100 Pa.

5. The electronic component manufacturing method of gate last method according to claim 1, wherein the third step forms the barrier film directly on the metal nitride film for controlling the operation voltage formed in the trench.

6. The electronic component manufacturing method of gate last method according to claim 1, wherein the method performs the third step to fourth step without exposing the object to be processed to an atmosphere.

7. The electronic component manufacturing method of gate last method according to claim 1, wherein the trench has an opening diameter of 22 nm or smaller.

8. The electronic component manufacturing method of gate last method according to claim 1, wherein, in the third step, the single barrier film including titanium nitride is deposited at a pressure of 100 Pa.

9. An electronic component manufacturing method of gate last method having a first step of forming a high-permittivity insulating film in a trench formed on an object to be processed; and a second step of forming a metal nitride film for controlling an operation voltage on the high-permittivity insulating film, the method comprising:

a third step of depositing, at room temperature, a single barrier film including titanium nitride on the metal nitride film for controlling the operation voltage by a sputtering method while forming a cusped magnetic field on a target surface, the single barrier film having (220) orientation, wherein a surface roughness of the single barrier film is less than 0.479 nm; and a fourth step of filling a low-melting-point metal film directly on the single barrier film under a temperature condition allowing the low-melting-point metal film to flow.

10. The electronic component manufacturing method of gate last method according to claim 9, wherein the trench has an opening diameter of 22 nm or smaller.

11. The electronic component manufacturing method of gate last method according to claim 1, wherein, in the fourth step, the low-melting-point metal film is filled while forming the cusped magnetic field on the target surface.

12. The electronic component manufacturing method of gate last method according to claim 9, wherein in the third step, the single barrier film including titanium nitride is deposited at a pressure of 100 Pa.

13. The electronic component manufacturing method of gate last method according to claim 9, wherein in the fourth step, the low-melting-point metal film is filled while forming the cusped magnetic field on the target surface.

* * * * *